(12) United States Patent
Sano et al.

(10) Patent No.: US 9,281,181 B2
(45) Date of Patent: Mar. 8, 2016

(54) FILM FORMING METHOD AND RECORDING MEDIUM FOR PERFORMING THE METHOD

(71) Applicant: HITACHI KOKUSAI ELECTRIC INC., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/582,646

(22) Filed: Dec. 24, 2014

(65) Prior Publication Data

US 2015/0187559 A1     Jul. 2, 2015

(30) Foreign Application Priority Data

Dec. 27, 2013    (JP) ................................ 2013-271388

(51) Int. Cl.
| | |
|---|---|
| H01L 21/31 | (2006.01) |
| C23C 16/00 | (2006.01) |
| H01L 21/02 | (2006.01) |
| C23C 16/30 | (2006.01) |
| C23C 16/455 | (2006.01) |
| C23C 16/507 | (2006.01) |

(52) U.S. Cl.
CPC .............. *H01L 21/022* (2013.01); *C23C 16/30* (2013.01); *C23C 16/45527* (2013.01); *C23C 16/45531* (2013.01); *C23C 16/45546* (2013.01); *C23C 16/45557* (2013.01); *C23C 16/507* (2013.01); *H01L 21/0228* (2013.01); *H01L 21/02175* (2013.01)

(58) Field of Classification Search
CPC ..................... H01L 21/0228; H01L 21/67017; H01L 21/02205; H01L 21/32055; H01L 21/02; H01L 21/67; C23C 16/45523; C23C 16/24; C23C 16/4408; C23C 16/0272
See application file for complete search history.

(56) References Cited

U.S. PATENT DOCUMENTS

| | | | | |
|---|---|---|---|---|
| 4,565,747 | A | * | 1/1986 | Nakae .................. C03C 17/225 264/81 |
| 2010/0098884 | A1 | | 4/2010 | Balseanu et al. |
| 2010/0108981 | A1 | * | 5/2010 | Jayasekara ............ B82Y 10/00 257/5 |
| 2013/0240830 | A1 | * | 9/2013 | Seacrist ............ H01L 21/02458 257/9 |
| 2014/0273507 | A1 | * | 9/2014 | Hirose .................... C23C 16/36 438/758 |
| 2014/0287597 | A1 | * | 9/2014 | Hirose .............. H01L 21/02172 438/786 |
| 2015/0228474 | A1 | * | 8/2015 | Hanashima ......... H01L 21/0228 438/778 |
| 2015/0243499 | A1 | * | 8/2015 | Yamamoto ........ H01L 21/02271 438/763 |
| 2015/0255274 | A1 | * | 9/2015 | Yamamoto ........ H01L 21/02167 438/765 |

FOREIGN PATENT DOCUMENTS

| | | |
|---|---|---|
| JP | 2004-136661 A | 5/2004 |
| JP | 2012-531045 A | 12/2012 |
| KR | 10-2012-0093139 A | 8/2012 |

* cited by examiner

*Primary Examiner* — Mohsen Ahmadi
(74) *Attorney, Agent, or Firm* — Volpe and Koenig, P.C.

(57) ABSTRACT

A method of manufacturing a semiconductor device includes forming a laminated film on a substrate by performing a cycle a predetermined number of times. The cycle includes forming a first film which contains a predetermined element, boron, and nitrogen and which does not contain a borazine ring skeleton, and forming a second film which contains the predetermined element and a borazine ring skeleton. The first film and the second film are laminated to form the laminated film.

9 Claims, 14 Drawing Sheets

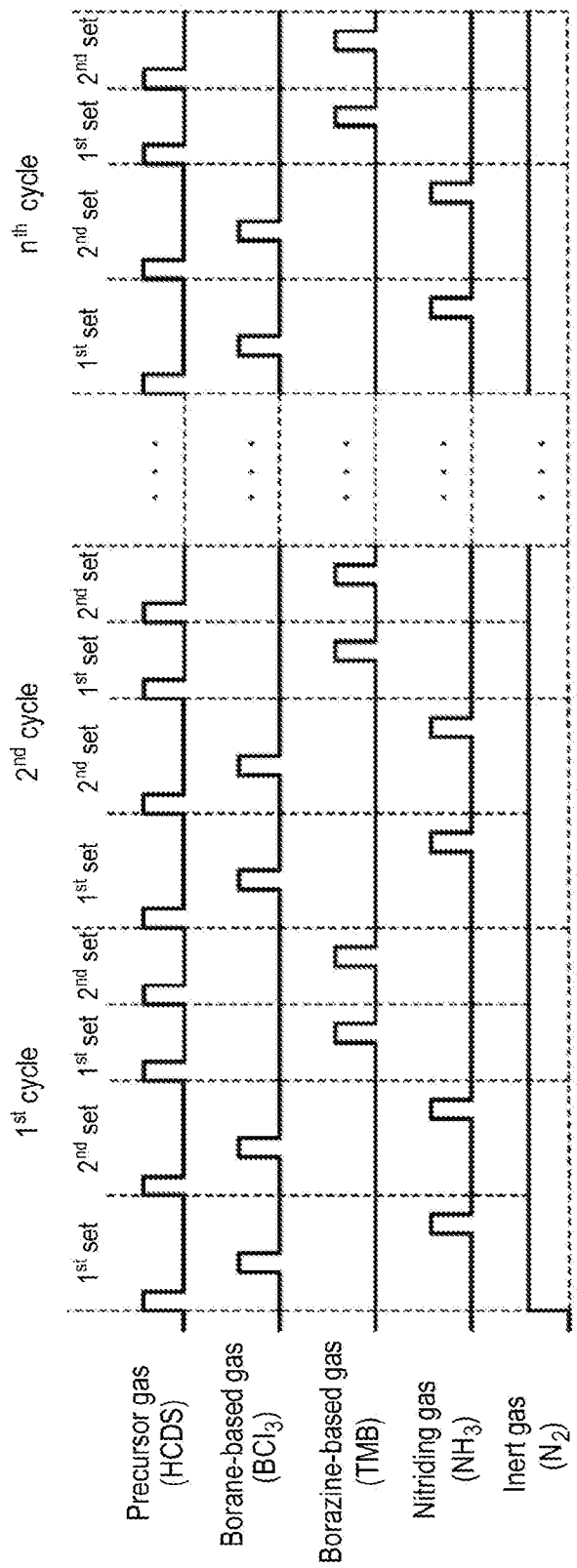

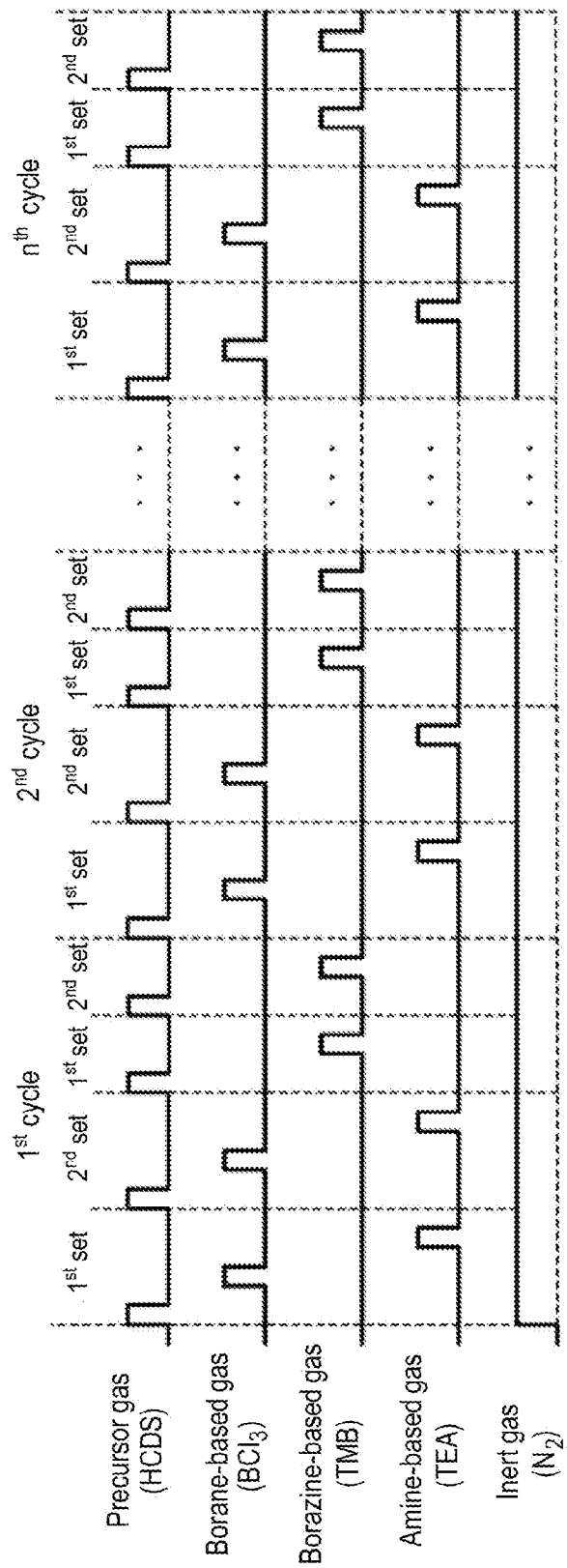

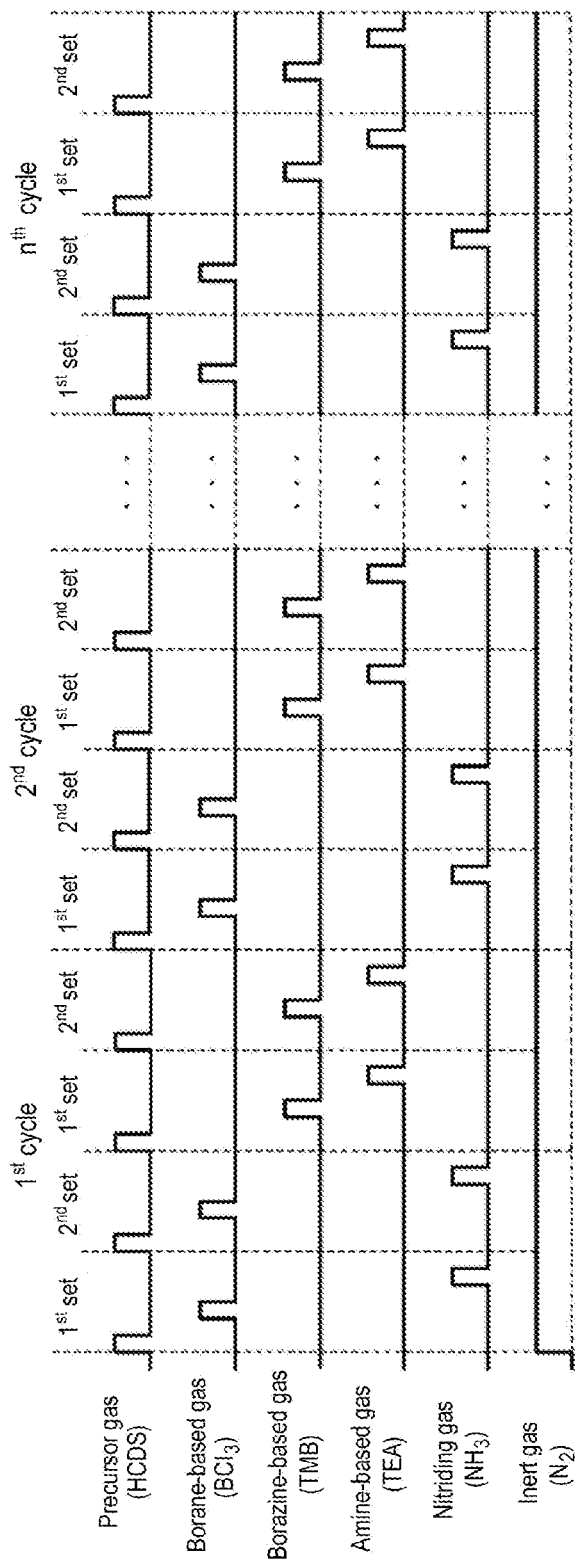

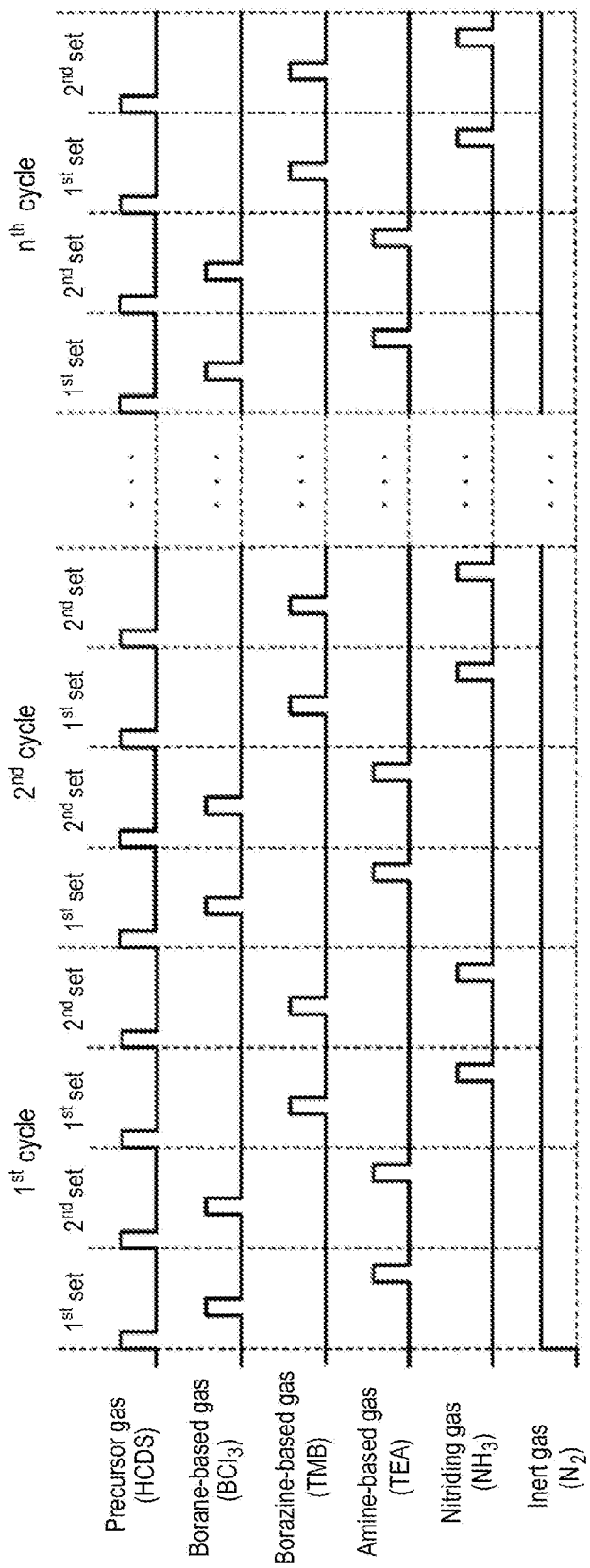

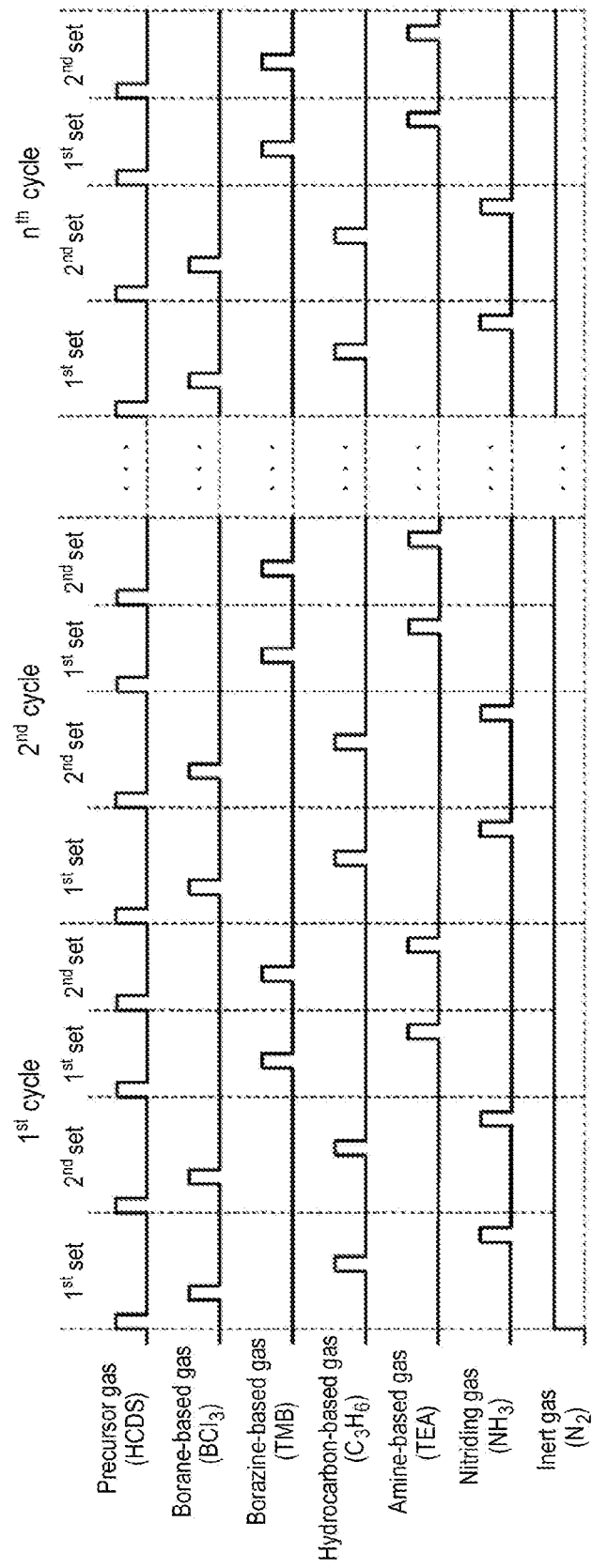

US 9,281,181 B2

FILM FORMING METHOD AND RECORDING MEDIUM FOR PERFORMING THE METHOD

CROSS-REFERENCE TO RELATED APPLICATION

This application is based upon and claims the benefit of priority from Japanese Patent Application No. 2013-271388, filed on Dec. 27, 2013, the entire contents of which are incorporated herein by reference.

TECHNICAL FIELD

The present disclosure relates to a method of manufacturing a semiconductor device, which includes a process of forming a thin film on a substrate, a substrate processing apparatus, and a recording medium.

BACKGROUND

As sizes of transistors decrease, a thin film such as an insulating film which constitutes a sidewall spacer (SWS) of a gate electrode or the like may require a decrease in film forming temperature, an improved resistance to hydrogen fluoride (HF), and a decrease in dielectric constant. To this end, it has been considered to use, as an insulating film, a silicon boronitride (SiBN) film obtained by adding boron (B) to a silicon nitride film (SiN film) or a silicon borocarbonitride (SiBCN) film obtained by adding boron (B) and carbon (C) to a silicon nitride film (SiN film).

Such an insulating film is often formed by an alternating supply method that alternately supplies several kinds of process gases because high step coverage characteristics are required. For example, using a silicon (Si)-containing gas as a silicon precursor, a boron-containing gas as a boron precursor, a carbon-containing gas as a carbon precursor, and a nitrogen-containing gas as a nitrogen precursor, a SiBCN film can be formed on a substrate by performing a predetermined number of times a cycle that sequentially supplies those process gases to the substrate. However, the aforementioned method has a limit in enhancing the controllability of a composition ratio control operation and the controllability of a film property control operation.

SUMMARY

The present disclosure provides some embodiments of a technique capable of enhancing the controllability of a composition ratio control operation and the controllability of a film property control operation when forming a thin film.

According to an aspect of the present disclosure, there is provided a method of manufacturing a semiconductor device, including forming a laminated film on a substrate by performing a cycle a predetermined number of times, the cycle including: forming a first film which contains a predetermined element, boron, and nitrogen and which does not contain a borazine ring skeleton; and forming a second film which contains the predetermined element and a borazine ring skeleton, wherein the first film and the second film are laminated to form the laminated film.

BRIEF DESCRIPTION OF THE DRAWINGS

FIG. 4A is a view showing a gas supply timing in a film forming sequence according to one embodiment of the present disclosure.

FIGS. 5A and 5B are views respectively showing second and third modified examples of the gas supply timing in the film forming sequence.

FIGS. 6A and 6B are views respectively showing fourth and fifth modified examples of the gas supply timing in the film forming sequence.

FIGS. 7A and 7B are views respectively showing sixth and seventh modified examples of the gas supply timing in the film forming sequence.

FIGS. 8A and 8B are views respectively showing eighth and ninth modified examples of the gas supply timing in the film forming sequence.

DETAILED DESCRIPTION

One Embodiment of the Present Disclosure

Hereinafter, one embodiment of the present disclosure will now be described with reference to FIGS. 1 to 3.

(1) CONFIGURATION OF SUBSTRATE PROCESSING APPARATUS

Figure 1:
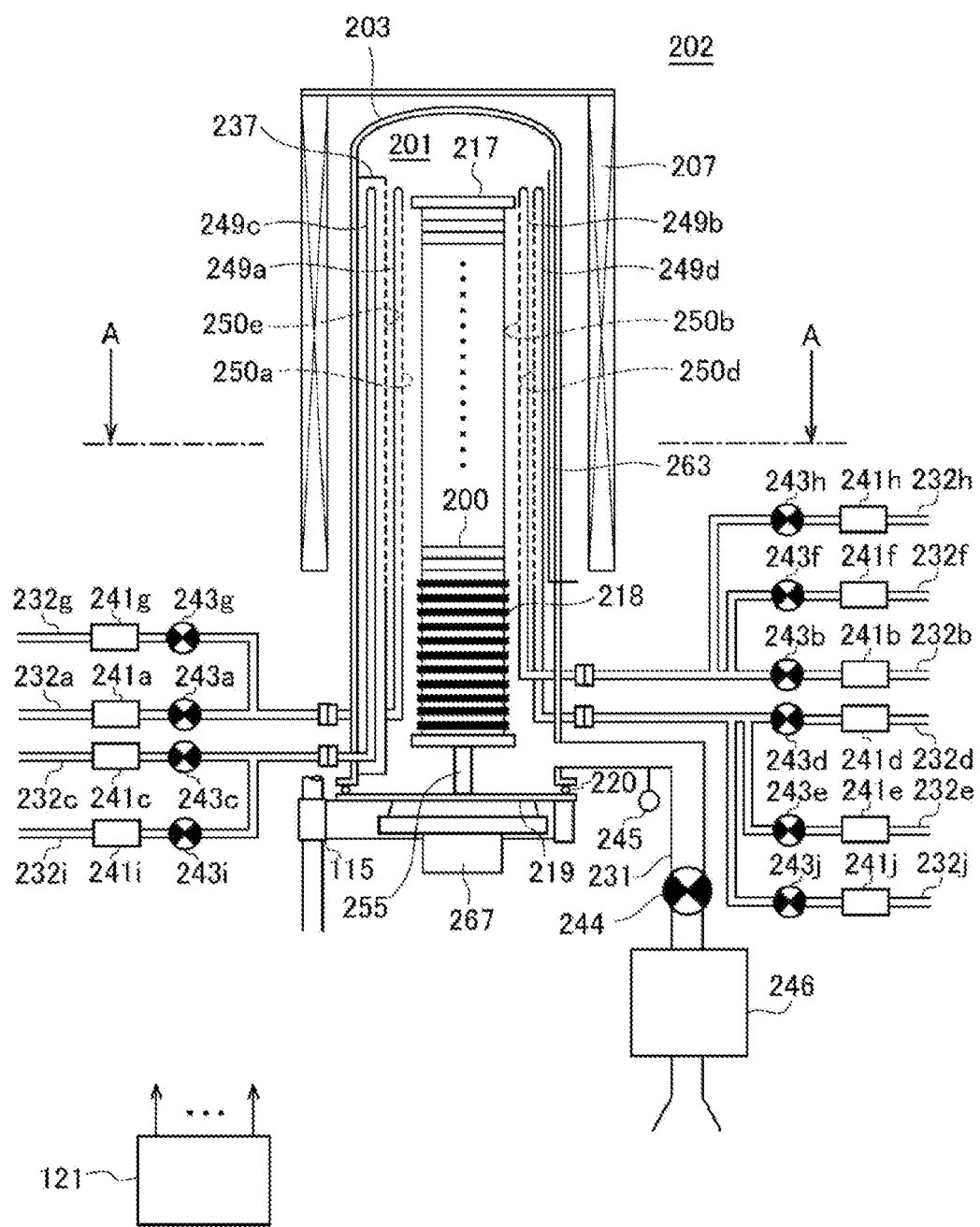
FIG. 1 is a schematic configuration view of a vertical processing furnace of a substrate processing apparatus according to one embodiment of the present disclosure, in which the processing furnace is shown in a longitudinal cross-sectional view.

As shown in FIG. 1, a processing furnace 202 includes a heater 207 as a heating unit (heating mechanism). The heater 207 has a cylindrical shape and is supported by a heater base (not shown) serving as a support plate so as to be vertically installed. As will be described later, the heater 207 functions as an activation mechanism (excitation unit) configured to thermally activate (excite) a gas.

A reaction tube 203 constituting a reaction vessel (process vessel) is disposed inside the heater 207 in a concentric form along with the heater 207. The reaction tube 203 is made of a heat resistant material such as quartz ($SiO_2$) or silicon carbide (SiC) and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked in multiple stages along a vertical direction in a boat 217 which will be described later.

Nozzles 249a to 249d are installed in the process chamber 201 to penetrate through a lower portion of the reaction tube 203. Gas supply pipes 232a to 232d are respectively connected to the nozzles 249a to 249d. A gas supply pipe 232f is connected to the gas supply pipe 232b. A gas supply pipe 232e is connected to the gas supply pipe 232d. In this way, the four nozzles 249a to 249d and the six gas supply pipes 232a to 232f are installed in the reaction tube 203 so as to supply plural kinds of gases, e.g., six kinds of gases in this embodiment, into the process chamber 201.

However, the processing furnace 202 of the present embodiment is not limited to the above-described type. For example, a manifold (not shown) made of metal and configured to support the reaction tube 203 may be installed under the reaction tube 203 such that respective nozzles may be installed to penetrate through a sidewall of the manifold. In this case, an exhaust pipe 231 described later may be further installed at the manifold. In addition, even in this case, the exhaust pipe 231 may be installed at a lower portion of the reaction tube 203 rather than at the manifold. A furnace port of the processing furnace 202 may be formed of metal, and the nozzles or the like may be installed at the metal furnace port.

Mass flow controllers (MFC) 241a to 241f, which are flow rate controllers (flow rate control units), and valves 243a to 243f, which are opening/closing valves, are installed in the gas supply pipes 232a to 232f in this order from an upstream side, respectively. Gas supply pipes 232g to 232j configured to supply an inert gas are connected to the gas supply pipes 232a to 232d at downstream sides of the valves 243a to 243d, respectively. Mass flow controllers (MFC) 241g to 241j, which are flow rate controllers (flow rate control parts), and valves 243g to 243j, which are opening/closing valves, are installed in the gas supply pipes 232g to 232j in this order from an upstream side, respectively.

The above-described nozzles 249a, 249b and 249d are respectively connected to leading ends of the gas supply pipes 232a, 232b and 232d. As shown in FIG. 2, the respective nozzles 249a, 249b and 249d are disposed in an annular space between an inner wall of the reaction tube 203 and the wafers 200 and are vertically installed so as to extend upward along a stacking direction of the wafers 200 from the lower portion of the inner wall of the reaction tube 203 to the upper portion thereof. That is to say, the nozzles 249a, 249b and 249d are installed in a region, which exists at a lateral side of a wafer arrangement region where the wafers 200 are arranged and which horizontally surrounds the wafer arrangement region, so as to extend along the wafer arrangement region. Each of the nozzles 249a, 249b and 249d is configured as an L-shaped long nozzle. A horizontal portion of each of the nozzles 249a, 249b and 249d is installed so as to penetrate through a lower sidewall of the reaction tube 203. A vertical portion of each of the nozzles 249a, 249b and 249d is installed so as to extend upward at least from one end portion of the wafer arrangement region toward the other end portion thereof. A plurality of gas supply holes 250a, 250b and 250d, through which gases are supplied, are respectively formed on side surfaces of the nozzles 249a, 249b and 249d. The gas supply holes 250a, 250b and 250d are respectively opened toward the center of the reaction tube 203 to enable gases to be supplied toward the wafers 200. The gas supply holes 250a, 250b and 250d are formed in a plural number so as to span from the lower portion of the reaction tube 203 to the upper portion thereof. The respective gas supply holes 250a, 250b and 250d have the same opening area and are formed at a predetermined opening pitch.

A nozzle 249c is connected to a leading end portion of the gas supply pipe 232c. The nozzle 249c is installed within a buffer chamber 237 which serves as a gas dispersion space. The buffer chamber 237 is installed in an annular space between the inner wall of the reaction tube 203 and the wafers 200 spanning from the lower portion of the inner wall of the reaction tube 203 to the upper portion thereof, so as to extend along the stacking direction of the wafers 200. That is to say, the buffer chamber 237 is installed in a region, which exists at a lateral side of the wafer arrangement region and which horizontally surrounds the wafer arrangement region, so as to extend along the wafer arrangement region. Gas supply holes 250e, through which gases are supplied, are formed at an end portion of a wall of the buffer chamber 237 adjacent to the wafers 200. The gas supply holes 250e are opened toward the center of the reaction tube 203 so that the gases can be supplied toward the wafers 200. A plurality of gas supply holes 250e are formed over a region spanning from the lower portion of the reaction tube 203 to the upper portion thereof. The respective gas supply holes 250e have the same opening area and are formed at a predetermined opening pitch.

The nozzle 249c is installed in an end portion of the buffer chamber 237 opposite to the end portion thereof in which the gas supply holes 250e are formed, so as to extend upward along the stacking direction of the wafers 200 from the lower portion of the inner wall of the reaction tube 203 to the upper portion thereof. That is to say, the nozzles 249c is installed in a region, which exists at the lateral side of the wafer arrangement region where the wafers 200 are arranged and which horizontally surrounds the wafer arrangement region, so as to extend along the wafer arrangement region. The nozzle 249c is configured as an L-shaped long nozzle. A horizontal portion of the nozzle 249c is installed so as to penetrate through a lower sidewall of the reaction tube 203. A vertical portion of the nozzle 249c is installed so as to extend upward at least from one end portion of the wafer arrangement region toward the other end portion thereof. Gas supply holes 250c, through which gases are supplied, are formed on a side surface of the nozzle 249c. The gas supply holes 250c are opened toward the center of the reaction tube 203. Similar to the gas supply holes 250e, a plurality of gas supply holes 250c are formed over a region spanning from the lower portion of the reaction tube 203 to the upper portion thereof. When a pressure difference between an interior of the buffer chamber 237 and an interior of the process chamber 201 is small, the gas supply holes 250c may be configured to have a constant opening area and a constant opening pitch from an upstream side (i.e., a lower portion) to a downstream side (i.e., an upper portion). In contrast, when the pressure difference is large, the opening area may become gradually larger and the opening pitch may become gradually smaller from the upstream side toward the downstream side.

By adjusting the opening area or the opening pitch of the respective gas supply holes 250c from the upstream side to the downstream side as described above, gases may be ejected from the respective gas supply holes 250c substantially at the same flow rate despite a flow velocity difference. The gas that flows out from the individual gas supply holes 250c is first introduced into the buffer chamber 237. This makes it possible to make the flow velocity of the gases within the buffer chamber 237 uniform. The particle velocity of the gases ejected from the respective gas supply holes 250c into the buffer chamber 237 are reduced in the buffer chamber 237. Then the gases are ejected from the respective gas supply holes 250e into the process chamber 201. The gases ejected from the respective gas supply holes 250c into the buffer chamber 237 have a uniform flow rate and flow velocity when ejected from the respective gas supply holes 250e into the process chamber 201.

As described above, in the present embodiment, the gas is transferred through the nozzles 249a to 249d and the buffer chamber 237 disposed in an annular vertically-elongated space, i.e., a cylindrical space, defined by the inner wall of the reaction tube 203 and the end portions of the stacked wafers 200. The gas is initially ejected into the reaction tube 203 near the wafers 200 through the gas supply holes 250a to 250e formed in the nozzles 249a to 249d and the buffer chamber 237, respectively. Then, a main flow of the gas within the reaction tube 203 is oriented in a direction parallel to surfaces of the wafers 200, i.e., a horizontal direction. With this configuration, the gas can be uniformly supplied to the respective wafers 200. This makes it possible to enhance the uniformity of a thickness of a thin film formed on each of the wafers 200. The gas flowing on the surfaces of the wafers 200, i.e., the reacted residual gas, flows toward an exhaust port, i.e., the exhaust pipe 231. The flow direction of the residual gas is not limited to a vertical direction but may be appropriately decided depending on a position of the exhaust port.

A precursor gas containing a specified element, e.g., a halosilane precursor gas containing Si as a specified element and a halogen element, is supplied from the gas supply pipe 232a into the process chamber 201 through the MFC 241a, the valve 243a and the nozzle 249a.

The halosilane precursor gas refers to a halosilane precursor remaining in a gaseous state, e.g., a gas obtained by vaporizing a halosilane precursor remaining in a liquid state under a normal temperature and a normal pressure, a halosilane precursor remaining in a gaseous state under a normal temperature and a normal pressure, or the like. The halosilane precursor is a silane precursor having a halogen group. The halogen group includes a chloro group, a fluoro group and a bromo group. That is to say, the halogen group includes a halogen element such as chlorine (Cl), fluorine (F), bromine (Br) or the like. That is, here, the halosilane precursor may refer to a kind of halide. The term "precursor" used herein means a "liquid precursor in a liquid state", or a "precursor gas in a gaseous state", or both.

As the halosilane precursor gas, e.g., a precursor gas containing Si and Cl, namely a chlorosilane precursor gas may be used. As the chlorosilane precursor gas, e.g., a hexachlorodisilane ($Si_2Cl_6$, abbreviation: HCDS) gas may be used. In the case of using a liquid precursor, such as HCDS or the like, which remains in a liquid state under a normal temperature and a normal pressure, the liquid precursor is vaporized by a vaporization system such as a vaporizer, a bubbler or the like and is supplied as a precursor gas (HCDS gas).

As a boron-containing gas which does not include a borazine ring skeleton, e.g., a borane-based gas, is supplied from the gas supply pipe 232b into the process chamber 201 through the MFC 242b, the valve 243b and the nozzle 249b.

The borane-based gas refers to a borane compound remaining in a gaseous state, e.g., a gas obtained by vaporizing a borane compound remaining in a liquid state under a normal temperature and a normal pressure, a borane compound remaining in a gaseous state under a normal temperature and a normal pressure, or the like. The borane compound includes a haloborane compound containing B and a halogen element, e.g., a chloroborane compound containing B and Cl. Furthermore, the borane compound includes borane (borohydride) such as monoborane ($BH_3$), diborane ($B_2H_6$) or the like, and any type of borane compound (borane derivative) in which H atoms of borane are substituted with other elements. The borane-based gas acts as a B source in a substrate processing process to be described later. As the borane-based gas, e.g., a trichloroborane ($BCl_3$) gas may be used. The $BCl_3$ gas is a boron-containing gas which does not contain a borazine compound to be described later, namely a non-borazine-based boron-containing gas.

A gas including a borazine ring skeleton, e.g., a gas including a borazine ring skeleton and an organic ligand, namely an organic borazine-based gas, is supplied from the gas supply pipe 232f into the process chamber 201 through the MFC 241f, the valve 243f, the gas supply pipe 232b, and the nozzle 249b.

As the organic borazine-based gas, e.g., a gas including an alkylborazine compound which is an organic borazine compound may be used. The organic borazine-based gas may be referred to as a borazine compound gas or a borazine-based gas.

Figure 9A:
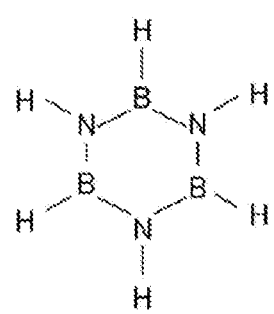
FIG. 9A is a view showing a chemical structural formula of borazine.
Figure 9B:
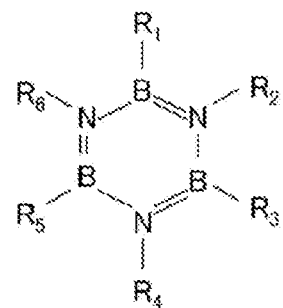
FIG. 9B is a view showing a chemical structural formula of a borazine compound.

In this regard, borazine is a heterocyclic compound composed of three elements, boron (B), nitrogen (N), and hydrogen (H). Borazine may be represented by a composition formula of $B_3H_6N_3$ and may be represented by a chemical structural formula shown in FIG. 9A. A borazine compound is a compound which includes a borazine ring skeleton (also referred to as a "borazine skeleton") constituting a borazine ring including three B atoms and three N atoms. The organic borazine compound is a borazine compound containing carbon (C) and may also be referred to as a borazine compound containing a C-containing ligand, namely an organic ligand. The alkylborazine compound is a borazine compound containing an alkyl group and may be referred to as a borazine compound containing an alkyl group as an organic ligand. The alkylborazine compound is a compound in which at least one of six hydrogen (H) atoms contained in borazine is substituted with a hydrocarbon containing one or more C atoms, and may be represented by a chemical structural formula shown in FIG. 9B. In this case, each of $R_1$ to $R_6$ in the chemical structural formula shown in FIG. 9B is a H atom or an alkyl group containing one to four C atoms. $R_1$ to $R_6$ may be the same kind of alkyl group or may be different kinds of alkyl groups. However, not all of $R_1$ to $R_6$ is H. The alkylborazine compound may refer to a substance which has a borazine ring skeleton constituting a borazine ring and which contains B, N, H and C. Moreover, the alkylborazine compound may refer to a substance having a borazine ring skeleton and containing an alkyl ligand. In addition, each of $R_1$ to $R_6$ may be an H atom, or an alkenyl group or an alkynyl group containing one to four C atoms. $R_1$ to $R_6$ may be the same kind of alkenyl group or alkynyl group, or may be different kinds of alkenyl groups or alkynyl groups. However, not all of $R_1$ to $R_6$ is H.

The borane-based gas acts as a B source, a N source, and a C source in a substrate processing process to be described later.

Figure 9C:
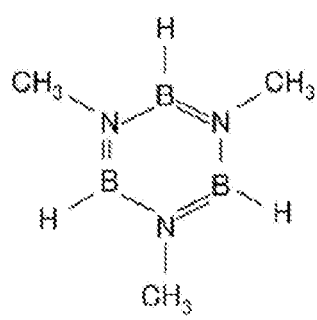
FIG. 9C is a view showing a chemical structural formula of n,n',n''-trimethylborazine.
Figure 9D:
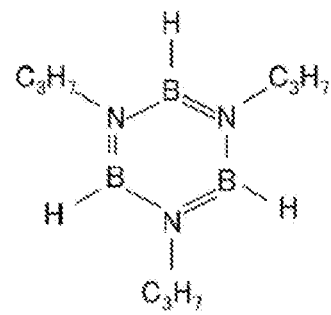
FIG. 9D is a view showing a chemical structural formula of n,n',n''-tri-n-propylborazine.

As the borane-based gas, it may be possible to use, e.g., an n,n',n''-trimethylborazine (abbreviation: TMB) gas, an n,n',n''-triethylborazine (abbreviation: TEB) gas, an n,n',n''-tri-n-propylborazine (abbreviation: TPB) gas, an n,n',n''-triisopropylborazine (abbreviation: TIPB) gas, an n,n',n''-tri-n-butylborazine (abbreviation: TBB) gas, an n,n',n''-triisobutylborazine (abbreviation: TIBB) gas, or the like. The TMB is a borazine compound in which $R_1$, $R_3$, and $R_5$ of the chemical structural formula shown in FIG. 9B are H atoms while $R_2$, $R_4$, and $R_6$ of the chemical structural formula are methyl groups. The TMB may be represented by a chemical structural formula shown in FIG. 9C. The TEB is a borazine compound in which $R_1$, $R_3$, and $R_5$ of the chemical structural formula shown in FIG. 9B are H atoms while $R_2$, $R_4$, and $R_6$ of the chemical structural formula are ethyl groups. The TPB is a borazine compound in which $R_1$, $R_3$, and $R_5$ of the chemical structural formula shown in FIG. 9B are H atoms while $R_2$, $R_4$, and $R_6$ of the chemical structural formula are propyl groups. The TPB may be represented by a chemical structural formula shown in FIG. 9D. The TIPB is a borazine compound in which $R_1$, $R_3$, and $R_5$ of the chemical structural formula shown in FIG. 9B are H atoms while $R_2$, $R_4$, and $R_6$ of the chemical structural formula are isopropyl groups. The TIBB is a borazine compound in which $R_1$, $R_3$, and $R_5$ of the chemical structural formula shown in FIG. 9B are H atoms while $R_2$, $R_4$, and $R_6$ of the chemical structural formula are isobutyl groups.

In the case of using a borazine compound such as TMB or the like which remains in a liquid state under a normal temperature and a normal pressure, the borazine compound in a liquid state is vaporized by a vaporization system such as a vaporizer or a bubbler and is supplied as a borane-based gas (e.g., a TMB gas).

A nitrogen-containing gas, e.g., a hydrogen nitride-based gas, is supplied from the gas supply pipe 232c into the process chamber 201 through the MFC 241c, the valve 243c, the nozzle 249c and the buffer chamber 237. The hydrogen nitride-based gas acts as a nitrogen gas, namely an N source, in a substrate processing process to be described later. As the hydrogen nitride-based gas, e.g., an ammonia ($NH_3$) gas may be used.

A gas containing N and C, e.g., an amine-based gas, is supplied from the gas supply pipe 232d into the process chamber 201 through the MFC 241d, the valve 243d and the nozzle 249d.

The amine-based gas is gaseous amine, e.g., a gas which is obtained by vaporizing amine remaining in a liquid state under a normal temperature and a normal pressure or a gas which contains an amine group such as amine or the like remaining in a gaseous state under a normal temperature and a normal pressure. The amine-based gas contains amine such as ethylamine, methylamine, propylamine, isopropylamine, butylamine, isobutylamine, or the like. As used herein, the term "amine" is a generic name of compounds in which a hydrogen atom in ammonia ($NH_3$) is substituted with a hydrocarbon group such as an alkyl group or the like. Amine contains a hydrocarbon group such as an alkyl group or the like as a ligand containing C atoms, namely an organic ligand. Since the amine-based gas contains three elements C, N, and H while not containing Si, it may be referred to as a Si-free gas. Since the amine-based gas does not contain Si and metal, it may be referred to as a Si-free and metal-free gas. The amine-based gas may be a substance consisting of only three elements C, N and H. The amine-based gas acts as a N source and as a C source in a substrate processing process to be described later. The term "amine" used herein means "amine remaining in a liquid state", an "amine-based gas remaining in a gaseous state", or both of them.

As the amine-based gas, it may be possible to use, e.g., triethylamine ($(C_2H_5)_3N$, abbreviation: TEA) in which the number of C-containing ligands (ethyl groups) in the chemical structural formula (in one molecule) is three and in which the number of C atoms in one molecule is larger than the number of N atoms. In the case of using amine such as TEA or the like which remains in a liquid state under a normal temperature and a normal pressure, the amine in a liquid state is vaporized by a vaporization system such as a vaporizer or a bubbler and is supplied as a gas containing N and C (e.g., a TEA gas).

A carbon-containing gas, e.g., a hydrocarbon-based gas, is supplied from the gas supply pipe 232e into the process chamber 201 through the MFC 241e, the valve 243e, the gas supply pipe 232d and the nozzle 249d. The hydrocarbon-based gas may be a substance consisting of only two elements C and H. The hydrocarbon-based gas acts as a C source in a substrate processing process to be described later. As the hydrocarbon-based gas, it may be possible to use, e.g., a propylene ($C_3H_6$) gas.

An inert gas, e.g., a nitrogen ($N_2$) gas, is supplied from the gas supply pipes 232g to 232j into the process chamber 201 through the MFCs 241g to 241j, the valves 243g to 243j, the gas supply pipes 232a to 232d, the nozzles 249a to 249d, and the buffer chamber 237.

In the case of supplying the aforementioned gases from the respective gas supply pipes, a precursor gas supply system for supplying a precursor gas containing a specified element is mainly configured by the gas supply pipe 232a, the MFC 241a, and the valve 243a. The nozzle 249a may be included in the precursor gas supply system. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

A boron-containing gas supply system for supplying a boron-containing gas which does not contain a borazine ring skeleton, namely a borazine-ring-skeleton-free boron-containing gas or a non-borazine-based boron-containing gas, is mainly configured by the gas supply pipe 232b, the MFC 241b, and the valve 243b. The nozzle 249b may be included in the boron-containing gas supply system. The precursor gas supply system may be referred to as a precursor supply system. In the case of supplying a borane-based gas from the gas supply pipe 232b, the boron-containing gas supply system may be referred to as a borane-based gas supply system or a borane compound supply system.

A borazine-based gas supply system for supplying a gas containing a borazine ring skeleton, namely a borazine-based gas, is mainly configured by the gas supply pipe 232f, the MFC 241f, and the valve 243f. The nozzle 249b existing at the downstream side of a connection portion where the gas supply pipe 232b is connected to the gas supply pipe 232f may be included in the borazine-based gas supply system. The borazine-based gas supply system may be referred to as an organic borazine-based gas supply system or a borazine compound supply system.

A nitrogen-containing gas supply system for supplying a nitrogen-containing gas is mainly configured by the gas supply pipe 232c, the MFC 241c, and the valve 243c. The nozzle 249c and the buffer chamber 237 may be included in the nitrogen-containing gas supply system. In the case of supplying a hydrogen nitride-based gas from the gas supply pipe 232c, the nitrogen-containing gas supply system may be referred to as a hydrogen nitride-based gas supply system, a hydrogen nitride supply system, or a nitriding gas supply system.

A nitrogen/carbon-containing gas supply system for supplying a gas containing N and C is mainly configured by the gas supply pipe 232d, the MFC 241d, and the valve 243d. The nozzle 249d may be included in the nitrogen/carbon-containing gas supply system. In the case of supplying an amine-based gas from the gas supply pipe 232d, the nitrogen/carbon-containing gas supply system may be referred to as an amine-based gas supply system or an amine supply system.

A carbon-containing gas supply system for supplying a carbon-containing gas is mainly configured by the gas supply pipe 232e, the MFC 241e, and the valve 243e. The nozzle 249d existing at the downstream side of a connection portion where the gas supply pipe 232d is connected to the gas supply pipe 232e may be included in the carbon-containing gas supply system. In the case of supplying a hydrocarbon-based gas from the gas supply pipe 232e, the carbon-containing gas supply system may be referred to as a hydrocarbon-based gas supply system or a hydrocarbon supply system.

An inert gas supply system is mainly configured by the gas supply pipes 232g to 232j, the MFCs 241g to 241j, and the valves 243g to 243j. The inert gas supply system may be referred to as a purge gas supply system or a carrier gas supply system.

Figure 2:
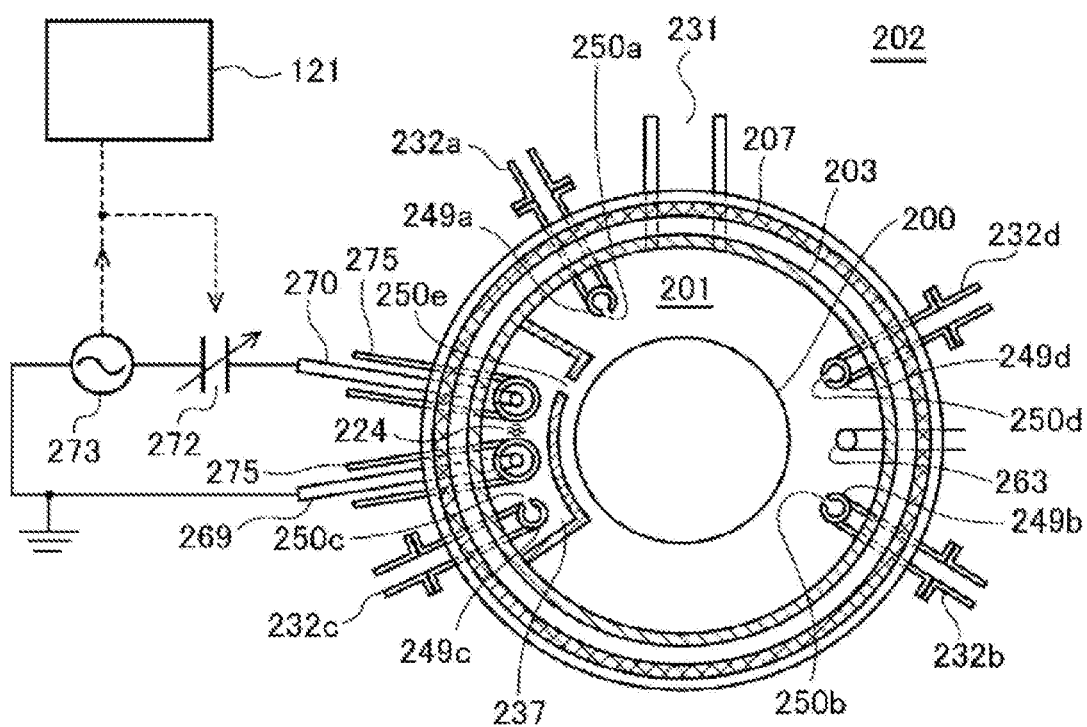
FIG. 2 is a schematic configuration view of the vertical processing furnace of the substrate processing apparatus according to one embodiment of the present disclosure, in which the processing furnace is shown in a cross-sectional view taken along line A-A in FIG. 1.

In the buffer chamber 237, as illustrated in FIG. 2, two rod-shaped electrodes 269 and 270, which are made of a conductor and which have an elongated structure, are disposed along the stacking direction of the wafers 200 so as to span from a lower portion of the reaction tube 203 to an upper portion thereof. Each of the rod-shaped electrodes 269 and 270 is disposed parallel to the nozzle 249c. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to a ground corresponding to a reference electric potential. By applying high-frequency power from the high-frequency power source 273 to between the rod-shaped electrodes 269 and 270 via the matcher 272, plasma is generated in a plasma generation region 224 between the rod-shaped electrodes 269 and 270. A plasma source as a plasma generator (plasma generating part) is mainly configured by the rod-shaped electrodes 269 and 270 and the electrode protection tube 275. The matcher 272 and the high-frequency power source 273 may also be included in the plasma source. As will be described later, the plasma source functions as an activating mechanism (exciting unit) that activates (excites) a gas into a plasma state.

The electrode protection tube 275 has a structure that each of the rod-shaped electrodes 269 and 270 can be inserted into the buffer chamber 237 while keeping each of the rod-shaped electrodes 269 and 270 isolated from an internal atmosphere of the buffer chamber 237. If an internal oxygen concentration of the electrode protection tube 275 is substantially equal to an oxygen concentration in ambient air (atmosphere), each of the rod-shaped electrodes 269 and 270 inserted into the electrode protection tube 275 may be oxidized by the heat generated from the heater 207. By charging the inside of the electrode protection tube 275 with an inert gas such as a nitrogen gas or the like, or by purging the inside of the electrode protection tube 275 with an inert gas such as a nitrogen gas or the like through the use of an inert gas purging mechanism, it is possible to reduce the internal oxygen concentration of the electrode protection tube 275, thereby preventing oxidation of the rod-shaped electrodes 269 and 270.

The exhaust pipe 231 for exhausting an internal atmosphere of the process chamber 201 is installed in the reaction tube 203. A vacuum exhaust device, for example, a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure regulating unit). The APC valve 244 is configured to perform/stop vacuum exhaust in the process chamber 201 by opening closing the valve with the vacuum pump 246 actuated. Further, the APC valve 244 is configured to regulate the internal pressure of the process chamber 201 by adjusting an opening degree of the valve pursuant to the pressure information detected by the pressure sensor 245 while keeping the vacuum pump 246 actuated. An exhaust system is mainly configured by the exhaust pipe 231, the APC valve 244, and the pressure sensor 245. The vacuum pump 246 may be included in the exhaust system.

A seal cap 219, which serves as a furnace port cover configured to hermetically seal a lower end opening of the reaction tube 203, is installed under the reaction tube 203. The seal cap 219 is configured to make contact with the lower end of the reaction tube 203 at the lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217 to be described later is installed at the opposite side of the seal cap 219 from the process chamber 201. A rotary shaft 255 of the rotary mechanism 267, which passes through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. That is to say, the boat elevator 115 is configured as a transfer device (transfer mechanism) that transfers the boat 217, i.e., the wafers 200, into and out of the process chamber 201.

The boat 217 as a substrate support is configured to support a plurality of, e.g., 25 to 200, wafers 200 in a horizontal posture and at multiple stages by vertically arranging the wafers 200 with the centers of the wafers 200 aligned with one another. That is to say, the boat 217 is configured to arrange the wafers 200 in a spaced-apart relationship. The boat 217 is made of a heat resistant material such as quartz or silicon carbide. Heat insulating plates 218 made of a heat resistant material such as quartz or silicon carbide are installed below the boat 217 in a horizontal posture and at multiple stages. With this configuration, hardly any of the heat generated from the heater 207 is transferred to the seal cap 219. However, the present embodiment is not limited to the aforementioned embodiment. For example, instead of installing the heat insulating plates 218 below the boat 217, a heat insulating tube as a tubular member made of a heat resistant material such as quartz or silicon carbide may be installed below the boat 217.

A temperature sensor 263, which is a temperature detector, is installed in the reaction tube 203. Based on temperature information detected by the temperature sensor 263, the state of power supply to the heater 207 is adjusted such that the interior of the process chamber 201 has a desired temperature distribution. Similar to the nozzles 249a to 249d, the temperature sensor 263 is configured to have an L-like shape. The temperature sensor 263 is installed along the inner wall of the reaction tube 203.

Figure 3:
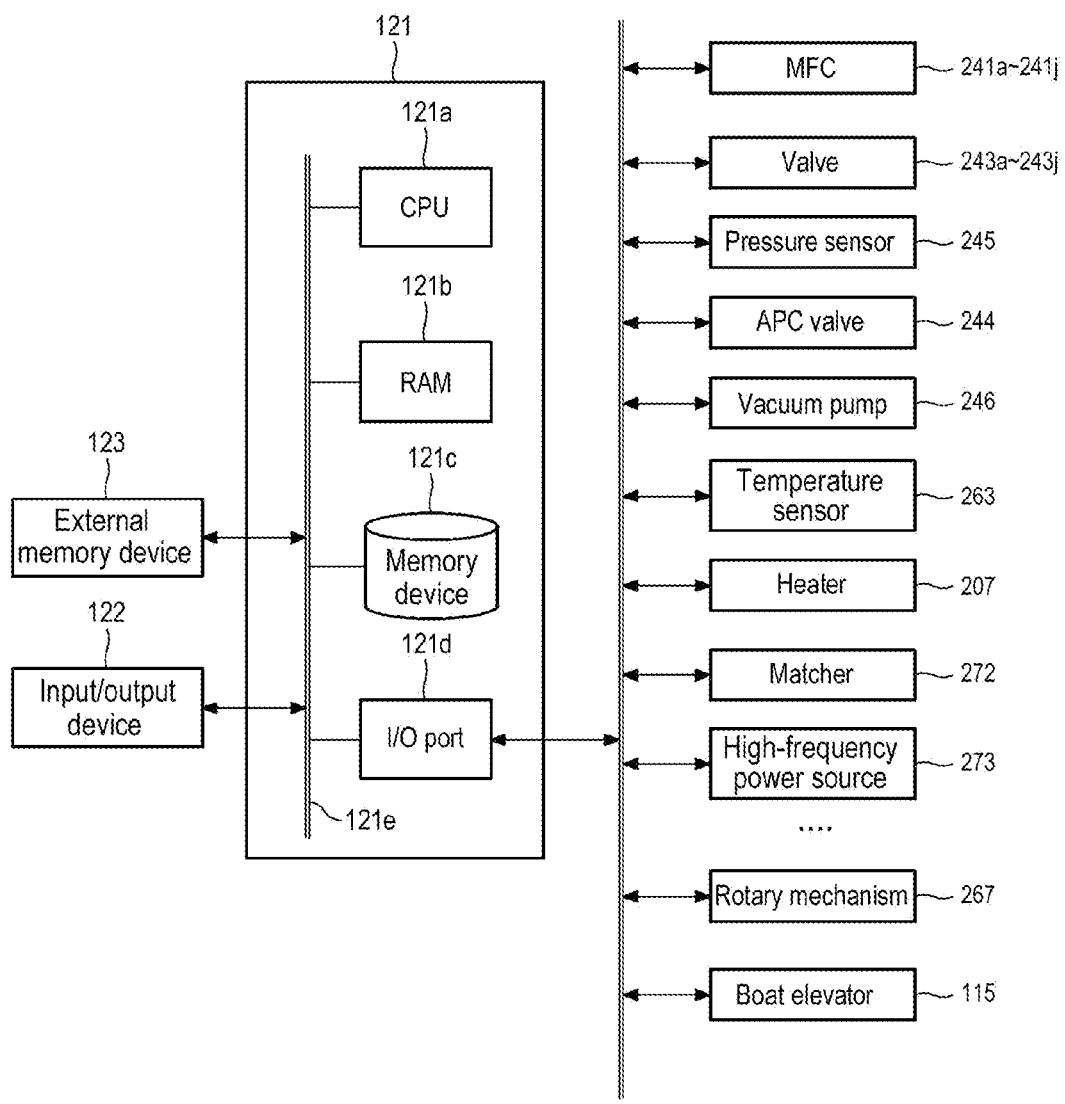
FIG. 3 is a schematic configuration view of a controller of the substrate processing apparatus according to one embodiment of the present disclosure, in which a control system of the controller is shown in a block diagram.

As illustrated in FIG. 3, a controller 121, which is a control unit (control means), is configured as a computer including a central processing unit (CPU) 121a, a random access memory (RAM) 121b, a memory device 121c, and an input/output (I/O) port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling the operation of the substrate processing apparatus or a process recipe, in which substrate processing sequences and conditions are written, is readably stored in the memory device 121c. The process recipe is designed to obtain a predetermined result by causing the controller 121 to execute the respective sequences of a substrate processing process to be described later. The process recipe serves as a program. Hereinafter, the process recipe and the control program will be generally referred to as a "program". By the term "program" used herein, it is intended to encompass only the process recipe, only the control program, or both. The RAM 121b is configured as a memory area (work area) in which a program or data read by the CPU 121a is temporarily stored.

The I/O port 121d is connected to the MFCs 241a to 241j, the valves 243a to 243j, the pressure sensor 245, the APC valve 244, the vacuum pump 246, the heater 207, the temperature sensor 263, the high-frequency power source 273, the matcher 272, the rotary mechanism 267, the boat elevator 115, and the like.

The CPU 121a is configured to read and execute the control program from the memory device 121c. As an operation command is inputted from the input/output device 122, the CPU 121a reads the process recipe from the memory device 121c. The CPU 121a is configured to, pursuant to the content of the process recipe thus read, control an operation of controlling the flow rates of various kinds of gases performed by the MFCs 241a to 241j, an opening/closing operation of the valves 243a to 243j, an opening/closing operation of the APC valve 244, a pressure regulating operation performed by the APC valve 244 based on the pressure sensor 245, a start/stop operation of the vacuum pump 246, a temperature adjusting operation performed by the heater 207 based on the temperature sensor 263, a power supply operation of the high-frequency power source 273, an impedance adjusting operation performed by the matcher 272, an operation of rotating the boat 217 and adjusting the rotation speed of the boat 217 performed by the rotary mechanism 267, an operation of moving the boat 217 up and down performed by the boat elevator 115, and the like.

The controller 121 is not limited to being configured as a dedicated computer but may be configured as a general-purpose computer. For example, the controller 121 of the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card) which stores the program, and installing the program on the general-purpose computer using the external memory device 123. However, a means for supplying the program to the computer is not limited to the case in which the program is supplied through the external memory device 123. For example, the program may be supplied through the use of a communication means such as the Internet or a dedicated line without having to go through the external memory device 123. The memory device 121c or the external memory device 123 is configured as a non-transitory computer-readable recording medium. Hereinafter, these means for supplying the program will be simply referred to as a "recording medium". By the term "recording medium" used herein, it is intended to encompass only the memory device 121c, only the external memory device 123, or both.

(2) SUBSTRATE PROCESSING PROCESS

Next, an example of a sequence of forming a thin film on a substrate, which is one of the processes of manufacturing a semiconductor device (device) through the use of the aforementioned substrate processing apparatus, will be described with reference to FIG. 4A. In the following description, the operations of the respective units or parts constituting the substrate processing apparatus are controlled by the controller 121.

In a film forming sequence shown in FIG. 4A, a laminated film composed of a first film and a second film laminated one above the other is formed on each of the wafers 200 as substrates by performing, a predetermined number of times (n times), a cycle which includes: a step of forming the first film which contains at least Si, B and N and which does not contain a borazine ring skeleton; and a step of forming the second film which contains at least Si and a borazine ring skeleton.

In the step of forming the first film, a borazine-ring-skeleton-free silicon boronitride (SiBN) film as the first film is formed by performing, a predetermined number of times ($m_1$ times), a first set which includes a step of supplying an HCDS gas as a Si-containing precursor gas to the wafers 200, a step of supplying a BC, gas as a borazine-ring-skeleton-free boron-containing gas to the wafers 200, and a step of supplying an $NH_3$ gas as a nitrogen-containing gas to the wafers 200.

In the step of forming the second film, a borazine-ring-skeleton-containing silicon borocarbonitride (SiBCN) film as the second film is formed by performing, a predetermined number of times ($m_2$ times), a second set which includes a step of supplying an HCDS gas as a Si-containing precursor gas to the wafers 200 and a step of supplying a TMB gas as a borazine-ring-skeleton-containing gas to the wafers 200, under a condition in which the borazine ring skeleton is maintained in the TMB gas.

By the wording "performing a first set, a second set or a cycle a predetermined number of times", it is meant that that the first set, the second set or the cycle is performed once or a plurality of times. That is to say, the wording means that the first set, the second set or the cycle is performed one or more times. FIG. 4A illustrates an example of repeating n times the aforementioned cycle in which the first set and the second set are performed twice.

The term "wafer" used herein means "a wafer per se" or "a laminated body (aggregate) including a wafer and a specified layer or film formed on a surface of the wafer". That is to say, the wafer including a specified layer or film formed on a surface of the wafer may be called "a wafer". The term "surface of a wafer" used herein means "a surface (exposed surface) of a wafer per se" or "a surface of a specified layer or film formed on a wafer, namely an outermost surface of a wafer as a laminated body".

Accordingly, by stating that "a specified gas is supplied to a wafer" used herein, it is meant that "a specified gas is directly supplied to a surface (exposed surface) of a wafer per se" or that "a specified gas is supplied to a layer or film formed on a wafer, namely to an outermost surface of a wafer as a laminated body". Moreover, by the stating that "a specified layer (or film) is formed on a wafer" used herein, it is meant that "a specified layer (or film) is directly formed on a surface (exposed surface) of a wafer per se" or that "a specified layer (or film) is formed on a layer or film formed on a wafer, namely on an outermost surface of a wafer as a laminated body".

The term "substrate" used herein is defined similar to the term "wafer". In this case, the "substrate" may be considered to replace the "wafer" defined as above.

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 via the O-ring 220.

(Pressure Regulation and Temperature Adjustment)

Vacuum exhaust is performed by the vacuum pump 246 such that the internal pressure of the process chamber 201, namely the pressure of a space where the wafers 200 exist, becomes equal to a desired pressure (vacuum level). At this time, the internal pressure of the process chamber 201 is measured by the pressure sensor 245. The APC valve 244 is feedback-controlled based on the measured pressure information. The vacuum pump 246 remains activated at least until the processing for the wafers 200 is completed. The wafers 200 existing within the process chamber 201 are heated by the heater 207 to a desired temperature. At this time, the state of power being supplied to the heater 207 is feedback-controlled based on the temperature information detected by the temperature sensor 263 such that the interior of the process chamber 201 has a desired temperature distribution. The heating of the interior of the process chamber 201 by the heater 207 is continuously performed at least until the processing of the wafers 200 is completed. The boat 217 and wafers 200 begin to be rotated by the rotary mechanism 267. The rotation of the boat 217 and the wafers 200 by the rotary mechanism 267 is continuously performed at least until the processing for the wafers 200 is completed.

(First Film Forming Process)

Thereafter, the following three steps, i.e., Steps 1 to 3 are sequentially performed.

[Step 1]

(HCDS Gas Supply)

The valve 243a is opened to cause the HCDS gas to flow through the gas supply pipe 232a. A flow rate of the HCDS gas is adjusted by the MFC 241a. The flow rate-adjusted HCDS gas is supplied into the process chamber 201 through the gas supply holes 250a and then exhausted through the exhaust pipe 231. At this time, the HCDS gas is supplied to the wafer 200. At the same time, the valve 243g is opened to cause a $N_2$ gas to flow through the gas supply pipe 232g. A flow rate of the $N_2$ gas is adjusted by the MFC 241g. The flow rate-adjusted $N_2$ gas is supplied into the process chamber 201 together with the HCDS gas and then exhausted through the exhaust pipe 231.

In order to prevent infiltration of the HCDS gas into the nozzles 249b to 249d and the buffer chamber 237, the valves 243h to 243j are opened to cause the $N_2$ gas to flow through the gas supply pipes 232h to 232j. The $N_2$ gas is supplied into the process chamber 201 via the gas supply pipes 232b to 232d, the nozzles 249b to 249d and the buffer chamber 237 and then exhausted through the exhaust pipe 231.

In this case, the APC valve 244 is appropriately adjusted such that the internal pressure of the process chamber 201 falls within a range of, e.g., 1 to 2,666 Pa, specifically, e.g., 67 to 1,333 Pa. A supply flow rate of the HCDS gas controlled by the MFC 241a is set to fall within a range of, e.g., 1 to 2,000 sccm, specifically, e.g., 10 to 1,000 sccm. A supply flow rate of the $N_2$ gas controlled by the MFCs 241g to 241j is set to fall within a range of, e.g., 100 to 10,000 sccm. A time period during which the HCDS gas is supplied to the wafer 200, i.e., a gas supply time (an irradiation time), is set to fall within a range of, e.g., 1 to 120 seconds, specifically, e.g., 1 to 60 seconds. The temperature of the heater 207 is set such that the temperature of the wafer 200 falls within a range of, e.g., 250 to 700 degrees C., specifically, e.g., 300 to 650 degrees C., or more specifically, e.g., 350 to 600 degrees C.

When the temperature of the wafer 200 is less than 250 degrees C., a practical deposition rate (or film forming rate) may not be obtained because the HCDS is hardly chemisorbed to the wafer 200. This problem can be solved by increasing the temperature of the wafer 200 to 250 degrees C. or more. By setting the temperature of the wafer 200 at 300 degrees C. or more, or more specifically 350 degrees C. or more, the HCDS can be more sufficiently adsorbed to the wafer 200. With such a configuration, a further sufficient film forming rate can be obtained.

If the temperature of the wafer 200 exceeds 700 degrees C., a CVD reaction is made stronger (a gas phase reaction becomes dominant). Thus, the film thickness uniformity may be degraded, making it difficult to control the film thickness uniformity. By setting the temperature of the wafer 200 at 700 degrees C. or less, such degradation of the film thickness uniformity can be suppressed, and it becomes possible to control the film thickness uniformity. In particular, by setting the temperature of the wafer 200 to 650 degrees C. or less, or furthermore 600 degrees C. or less, the surface reaction becomes dominant. This makes it easy to assure the film thickness uniformity and to control the film thickness uniformity.

Accordingly, the temperature of the wafer 200 may be set to fall within a range of 250 to 700 degrees C., specifically, 300 to 650 degrees C., or more specifically 350 to 600 degrees C.

By supplying the HCDS gas to the wafer 200 under the aforementioned conditions, a first layer, e.g., a silicon-containing layer containing chlorine (Cl) and having a thickness of, e.g., less than one atomic layer to several atomic layers is formed on the wafer 200 (a base film of the surface). The silicon-containing layer containing chlorine (Cl) may be a silicon layer (a Si layer) containing Cl, an adsorption layer of the HCDS gas, or both.

The term "silicon layer containing Cl" is a generic name which encompasses not only a continuous or discontinuous layer formed of Si and containing Cl but also a Si thin film containing Cl obtained by laminating such layers. The continuous layer formed of Si and containing Cl may be referred to as a silicon thin film containing Cl. In addition, the Si that constitutes the silicon layer containing Cl includes Si whose bond to Cl is not completely broken, in addition to Si whose bond to Cl is completely broken.

The adsorption layer of the HCDS gas includes not only a continuous adsorption layer of molecules of the HCDS gas but also a discontinuous adsorption layer thereof. In other words, the adsorption layer of the HCDS gas may include an adsorption layer formed of HCDS molecules and having a thickness of one molecular layer or less than one molecular layer. HCDS molecules that constitute the adsorption layer of the HCDS gas include one or more molecules in which a bond between Si and Cl is partially broken. That is to say, the adsorption layer of the HCDS gas may include a physical adsorption layer of the HCDS gas, a chemical adsorption layer of the HCDS gas, or both.

In this regard, the layer having a thickness of less than one atomic layer means an atomic layer that is discontinuously formed. The layer having a thickness of one atomic layer means an atomic layer that is continuously formed. The layer having a thickness of less than one molecular layer means a molecular layer that is discontinuously formed. The layer having a thickness of one molecular layer means a molecular layer that is continuously formed. The silicon-containing layer containing Cl may include both a silicon layer containing Cl and an adsorption layer of the HCDS gas. As described above, expressions such as "one atomic layer", "several atomic layers" and the like will be used with respect to the silicon-containing layer containing Cl.

Under a condition in which the HCDS gas is autolyzed (or pyrolyzed), i.e., a condition in which a pyrolysis reaction of the HCDS gas occurs, Si is deposited on the wafer 200 to form the silicon layer containing Cl. Under a condition in which the HCDS gas is not autolyzed (or pyrolyzed), i.e., a condition in which a pyrolysis reaction of the HCDS gas does not occur, the HCDS gas is adsorbed onto the wafer 200 to form the adsorption layer of the HCDS gas. From the viewpoint of increasing a film forming rate, when the silicon layer containing Cl is formed on the wafer 200, the film forming rate may be greater than that when the adsorption layer of the HCDS gas is formed on the wafer 200.

If the thickness of the silicon-containing layer containing Cl formed on the wafer 200 exceeds several atomic layers, a modification action at Step 2 to be described later does not affect the entire first layer. In addition, a minimum value of the thickness of the first layer to be formed on the wafer 200 is less than one atomic layer. Accordingly, the thickness of the first layer may be set to fall within a range of less than one atomic layer to several atomic layers. By setting the thickness of the first layer to become equal to one atomic layer or less, i.e., one atomic layer or less than one atomic layer, it is possible to relatively increase the action of the modification reaction at Step 2 to be described later and to shorten the time required in the modification reaction at Step 2. It is also possible to shorten the time required in forming the first layer at Step 1. Thus, a processing time per cycle can be reduced, and a total processing time can also be reduced. As such, the film forming rate can be increased. In addition, if the thickness of the first layer is set to become equal to one atomic layer or less, it is possible to improve the controllability of the film thickness uniformity.

(Residual Gas Removal)

After the first layer is formed, the valve 243a is closed to stop the supply of the HCDS gas. At this time, the APC valve 244 is kept opened and the interior of the process chamber 201 is vacuum-exhausted by the vacuum pump 246, whereby the unreacted HCDS gas or the HCDS gas contributed to the formation of the first layer, which remains within the process chamber 201, is removed from the process chamber 201. At this time, the valves 243g to 243j are kept opened and the supply of the $N_2$ gas into the process chamber 201 is maintained. The $N_2$ gas serves as a purge gas. Thus, the HCDS gas remaining within the process chamber 201 can be effectively removed from the process chamber 201.

At this time, the gas remaining in the process chamber 201 may not be completely removed and the interior of the process chamber 201 may not be completely purged. If the gas remaining in the process chamber 201 is small in amount, no adverse effect is generated at Step 2 performed thereafter. The amount of the $N_2$ gas supplied into the process chamber 201 need not be a large amount. For example, if the $N_2$ gas is supplied in an amount substantially equal to the volume of the reaction tube 203 (or the process chamber 201), it is possible to perform the purge in such a way that no adverse effect is generated at Step 2. Inasmuch as the interior of the process chamber 201 is not completely purged as mentioned above, it is possible to shorten the purge time and to improve the throughput. It also becomes possible to reduce the consumption of the $N_2$ gas to a minimum necessary level.

As the precursor gas, it is possible to use not only the HCDS gas but also an inorganic precursor gas such as a tetrachlorosilane gas, i.e., a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas, or the like. As the inert gas, it is possible to use not only the $N_2$ gas but also a rare gas such as an Ar gas, a He gas, a Ne gas, a Xe gas, or the like.

[Step 2]
($BCl_3$ Gas Supply)

After Step 1 is completed, a $BCl_3$ gas is supplied to the wafer 200 existing within the process chamber 201.

In this step, the opening/closing control of the valves 243b and 243g to 243j is performed in the same or similar manner as the opening/closing control of the valves 243a and 243g to 243j performed at Step 1. The supply flow rate of the $BCl_3$ gas controlled by the MFC 241b is set to fall within a range of, e.g., 100 to 10,000 sccm. The internal pressure of the process chamber 201 is set to fall within a range of, e.g., 1 to 2,666 Pa, or specifically, e.g., 67 to 1,333 Pa. The partial pressure of the $BCl_3$ gas within the process chamber 201 is set to fall within a range of, e.g., 0.01 to 2,640 Pa. The time during which the $BCl_3$ gas is supplied to the wafer 200, namely the gas supply time (irradiation time), is set to fall within a range of, e.g., 1 to 120 seconds, or specifically, e.g., 1 to 60 seconds. Other processing procedures and processing conditions may be the same as, e.g., the processing procedures and processing conditions used at Step 1.

By supplying the $BCl_3$ gas to the wafer 200 under the aforementioned conditions, a boron-containing layer having a thickness of less than one atomic layer, namely a discontinuous boron-containing layer, is formed on the first layer. The boron-containing layer may include a boron layer, a chemical adsorption layer of the $BCl_3$ gas, or both. Depending on the conditions, the boron-containing layer may include a SiB layer which is formed by the reaction of the first layer with the $BCl_3$ gas and the resultant boriding (modification) of at least a portion of the first layer. The boron-containing layer is formed on the first layer, or the first layer is modified, whereby a second layer containing Si and B is formed on the wafer 200. Since the $BCl_3$ gas is a non-borazine-based boron-containing gas, the second layer becomes a borazine-ring-skeleton-free layer. The $BCl_3$ gas is supplied by thermally activating the same under a non-plasma condition. This makes it possible to softly perform the aforementioned reaction, thereby making it easy to form the second layer.

(Residual Gas Removal)

After the second layer is formed, the valve 243b is closed to stop the supply of the $BCl_3$ gas. Then, the unreacted $BCl_3$ gas, the $BCl_3$ gas contributed to the formation of the second layer, or the reaction byproduct, which remains within the process chamber 201, is removed from the interior of the process chamber 201 by the same processing procedures as used at Step 1. At this time, just like Step 1, the gas or the like which remains within the process chamber 201 may not be completely removed.

As the borazine-ring-skeleton-free boron-containing gas, it may be possible to use a halogenated boron-based gas (haloborane-based gas) other than the $BCl_3$ gas, e.g., a chloroborane-based gas other than the $BCl_3$ gas, a fluoroborane-based gas such as a trifluoroborane ($BF_3$) gas or the like, and a bromoborane-based gas such as a tribromoborane ($BBr_3$) gas or the like. It is also possible to use a borane-based gas such as a $B_2H_6$ gas or the like. It is also possible to use not only the inorganic borane-based gas but also an organic borane-based gas. As the inert gas, it is possible to use not only the $N_2$ gas but also a rare gas such as an Ar gas, a He gas, a Ne gas, a Xe gas, or the like.

[Step 3]
($NH_3$ Gas Supply)

After Step 2 is completed, a thermally-activated $NH_3$ gas or a plasma-activated $NH_3$ gas is supplied to the wafer 200 existing within the process chamber 201.

In the step of supplying the thermally-activated $NH_3$ gas, the opening/closing control of the valves 243c and 243g to 243*j* is performed in the same or similar manner as the opening/closing control of the valves 243*a* and 243*g* to 243*j* performed at Step 1. The supply flow rate of the NH$_3$ gas controlled by the MFC 241*c* is set to fall within a range of, e.g., 100 to 10,000 sccm. The internal pressure of the process chamber 201 is set to fall within a range of, e.g., 1 to 4,000 Pa, or specifically, e.g., 1 to 3,000 Pa. The partial pressure of the NH$_3$ gas within the process chamber 201 is set to fall within a range of, e.g., 0.01 to 3,960 Pa. By setting the internal pressure of the process chamber 201 so as to fall within such a relatively high pressure range, it becomes possible to thermally activate the NH$_3$ gas under a non-plasma condition. If the NH$_3$ gas is supplied by thermally activating the same, it is possible to generate a relatively soft reaction and to relatively softly perform the nitriding to be described layer. The time during which the thermally-activated NH$_3$ gas is supplied to the wafer 200, namely the gas supply time (irradiation time), is set to fall within a range of, e.g., 1 to 120 seconds, or specifically. e.g., 1 to 60 seconds. Other processing conditions may be the same as, e.g., the processing conditions used at Step 1.

In the step of supplying the plasma-activated NH$_3$ gas, the opening/closing control of the valves 243*c* and 243*g* to 243*j* is performed in the same manner as the opening/closing control of the valves 243*a* and 243*g* to 243*j* performed at Step 1. The supply flow rate of the NH$_3$ gas controlled by the MFC 241*c* is set to fall within a range of, e.g., 100 to 10,000 sccm. The high-frequency power applied between the rod-shaped electrodes 269 and 270 is set to fall within a range of, e.g., 50 to 1,000 W. The internal pressure of the process chamber 201 is set to fall within a range of, e.g., 1 to 100 Pa. The partial pressure of the NH$_3$ gas within the process chamber 201 is set to fall within a range of, e.g., 0.01 to 100 Pa. Even if the internal pressure of the process chamber 201 is set to fall within such a relatively low pressure range, it is possible to activate the NH$_3$ gas by using the plasma. The time during which active species obtained by plasma-exciting the NH$_3$ gas are supplied to the wafer 200, namely the gas supply time (irradiation time), is set to fall within a range of, e.g., 1 to 120 seconds, or specifically, e.g., 1 to 60 seconds. Other processing conditions may be the same as, e.g., the processing conditions used at Step 1.

By supplying the NH$_3$ gas to the wafer 200 under the aforementioned conditions, at least a portion of the second layer formed on the wafer 200 is nitrided (modified). As the second layer is modified, a third layer containing Si, B and N, namely a SiBN layer, is formed on the wafer 200. The third layer becomes a borazine-ring-skeleton-free layer. During the formation of the third layer, an impurity such as Cl or the like contained in the second layer forms a gaseous substance containing at least Cl in the course of the modification reaction of the second layer generated by the NH$_3$ gas. The gaseous substance thus formed is exhausted from the interior of the process chamber 201. That is to say, the impurity such as Cl or the like contained in the second layer is extracted or desorbed from the second layer and is eventually separated from the second layer. Thus, the third layer becomes a layer which is smaller in the amount of an impurity such as Cl or the like than the second layer.

(Residual Gas Removal)

After the third layer is formed, the valve 243*c* is closed to stop the supply of the NH$_3$ gas. In a case where the NH$_3$ gas is supplied by activating the same with plasma, the application of the high-frequency power between the rod-shaped electrodes 269 and 270 is stopped. Then, the unreacted NH$_3$ gas, the NH$_3$ gas contributed to the formation of the third layer, or the reaction byproduct, which remains within the process chamber 201, is removed from the interior of the process chamber 201 by the same processing procedures as used at Step 1. At this time, just like Step 1, the gas or the like which remains within the process chamber 201 may not be completely removed.

As the nitrogen-containing gas, it may be possible to use not only the NH$_3$ gas but also a hydrogen nitride-based gas such as a diazene (N$_2$H$_2$) gas, a hydrazine (N$_2$H$_4$) gas, a N$_3$H$_8$ gas or the like, or a gas containing each of these compounds. As the inert gas, it is possible to use not only the N$_2$ gas but also a rare gas such as an Ar gas, a He gas, a Ne gas, a Xe gas, or the like.

(Performing a First Set a Predetermined Number of Times)

By performing one set (a first set) including the aforementioned steps 1 to 3 a predetermined number of times (m$_1$ times), a first film, i.e., a SiBN film having a predetermined composition and a predetermined thickness, may be formed on the wafer 200. The first film becomes a borazine-ring-skeleton-free film, namely a non-porous film. At this time, the number of performing times of the first set is controlled such that the thickness of the first film becomes, e.g., 0.1 nm or more and 5 nm or less, or specifically, e.g., 0.1 nm or more and 1 nm or less. The first set is performed, e.g., one or more times and 50 times or less, or specifically, e.g., one or more times and 10 times or less. The first set may be repeated a plurality of times within the aforementioned range. That is to say, the thickness of the SiBN layer formed by performing the first set once may be set to be smaller than a desired film thickness and the first set is repeated a plurality of times until the thickness of the first film becomes the desired film thickness.

At this time, by controlling the processing conditions such as the internal pressure of the process chamber 201, the gas supply time and the like at the respective steps, it is possible to adjust the ratio of respective element components, namely a Si component, a B component and an N component, in the first film. That is to say, it is possible to adjust a Si concentration, a B concentration and an N concentration in the first film. This makes it possible to control the composition ratio of the SiBN film.

By stating that when the first set is performed a plurality of times, "a specified gas is supplied to the wafer 200" at least at the respective steps performed second and subsequent times, it is meant that "a specified gas is supplied to a layer formed on the wafer 200, namely on the outermost surface of the wafer 200 as a laminated body". By stating that "a specified layer is formed on the wafer 200", it is meant that "a specified layer is formed on a layer formed on the wafer 200, namely on the outermost surface of the wafer 200 as a laminated body". This is as described above. The above meaning may be applied in a case where the second set or the cycle to be described later is performed a plurality of times. Moreover, the above meaning may also be applied in the respective modified examples and other embodiments.

(Second Film Forming Process)

Thereafter, the following two steps, i.e., Steps 4 and 5 are sequentially performed.

[Step 4]

(HCDS Gas Supply)

A HCDS gas is supplied to the wafer 200 existing within the process chamber 201 by the same processing procedures and processing conditions as used at Step 1 described above. Thus, a fourth layer, e.g., a silicon-containing layer which contains Cl and has a thickness of less than one atomic layer to several atomic layers, is formed on the first film formed on the wafer 200, namely on the borazine-ring-skeleton-free SiBN film.

(Residual Gas Removal)

After the fourth layer is formed, the supply of the HCDS gas is stopped by the same procedures as used at Step 1. Furthermore, the unreacted HCDS gas or the HCDS gas contributed to the formation of the fourth layer, which remains within the process chamber 201, is removed from the interior of the process chamber 201. At this time, similar to Step 1, the gas which remains within the process chamber 201 may not be completely removed.

[Step 5]
(TMB Gas Supply)

After Step 4 is completed, a TMB gas is supplied to the wafer 200 existing within the process chamber 201.

In this step, the opening/closing control of the valves 243f and 243g to 243j is performed in the same or similar manner as the opening/closing control of the valves 243a and 243g to 243j performed at Step 1. The supply flow rate of the TMB gas controlled by the MFC 241f is set to fall within a range of, e.g., 1 to 1,000 sccm. The internal pressure of the process chamber 201 is set to fall within a range of, e.g., 1 to 2.666 Pa, or specifically, e.g., 67 to 1,333 Pa. The partial pressure of the TMB gas within the process chamber 201 is set to fall within a range of, e.g., 0.0001 to 2,424 Pa. The time during which the TMB gas is supplied to the wafer 200, namely the gas supply time (irradiation time), is set to fall within a range of, e.g., 1 to 120 seconds, or specifically, e.g., 1 to 60 seconds. Other processing procedures and processing conditions may be the same as, e.g., the processing procedures and processing conditions used at Step 1.

By supplying the TMB gas to the wafer 200 under the aforementioned conditions, the fourth layer formed at Step 4 reacts with the TMB gas. That is to say, the Cl (chloro group) contained in the fourth layer reacts with the ligand (methyl group) contained in the TMB. Consequently, the Cl of the fourth layer reacted with the ligand of the TMB can be separated (extracted) from the fourth layer, and the ligand of the TMB reacted with the Cl of the fourth layer can be separated from the TMB. Then, the N constituting a borazine ring of the TMB from which the ligand is separated can be bonded to the Si of the fourth layer. That is to say, among the B and the N constituting the borazine ring of the TMB, the N which is enabled to have an uncombined hand (i.e., dangling bond) due to the separation of the metal ligand may be bonded to the Si which is enabled to have a dangling bond due to the inclusion in the fourth layer or the Si which has a dangling bond from the outset, thereby forming a Si—N bond. At this time, the borazine ring skeleton constituting the borazine ring of the TMB is maintained without being broken.

By supplying the TMB gas under the aforementioned conditions, the fourth layer and the TMB can be caused to react with each other while maintaining the borazine ring skeleton in the TMB without destroying the same. This makes it possible to generate the series of reactions described above. The temperature of the wafer 200 and the internal pressure of the process chamber 201, particularly the temperature of the wafer 200 may be important factors (conditions) for generating the series of reactions while maintaining the borazine ring skeleton of the TMB. By appropriately controlling the temperature of the wafer 200 and the internal pressure of the process chamber 201, it becomes possible to generate a suitable reaction.

By virtue of the series of reactions, a borazine ring is newly introduced into the fourth layer. Thus, the fourth layer is changed (modified) to a fifth layer which has a borazine ring skeleton and which contains Si, B, C and N, namely a silicon borocarbonitride (SiBCN) layer which contains a borazine ring skeleton. The fifth layer becomes, e.g., a layer having a thickness of less than one atomic layer to several atomic layers. The SiBCN layer which contains a borazine ring skeleton may be referred to as a layer which contains Si, C and a borazine ring skeleton.

As a result of the borazine ring being newly introduced into the fourth layer, a B component and an N component which constitute the borazine ring are newly introduced into the fourth layer. At this time, a C component which was contained in the ligand of the TMB is also introduced into the fourth layer. By causing the fourth layer and the TMB to react with each other and introducing the borazine ring into the fourth layer in this way, it is possible to newly add a B component, a C component and an N component to the fourth layer.

During the formation of the fifth layer, the Cl which was contained in the fourth layer or the H which was contained in the TMB gas forms a gaseous substance containing at least Cl or H in the course of the modification reaction of the fourth layer generated by the TMB gas. The gaseous substance thus formed is exhausted from the interior of the process chamber 201. That is to say, the impurity such as Cl or the like contained in the fourth layer is extracted or desorbed from the fourth layer and is eventually separated from the fourth layer. Thus, the fifth layer becomes a layer which is smaller in the amount of an impurity such as Cl or the like than the fourth layer.

When forming the fifth layer, the borazine ring skeleton which constitutes the borazine ring contained in the TMB is maintained without being broken. It is therefore possible to maintain the central space of the borazine ring. This makes it possible to form a porous SiBCN layer.

(Residual Gas Removal)

After the fifth layer is formed, the valve 243f is closed to stop the supply of the TMB gas. Then, the unreacted TMB gas, the TMB gas contributed to the formation of the fifth layer, or the reaction byproduct, which remains within the process chamber 201, is removed from the interior of the process chamber 201 by the same processing procedures as used at Step 1. At this time, similar to Step 1, the gas or the like which remains within the process chamber 201 may not be completely removed.

As the gas which contains a borazine ring skeleton, it may be possible to use not only the TMB gas but also, e.g., a TEB gas, a TPB gas, a TIPB gas, a TBB gas, or a TIBB gas. As the inert gas, it is possible to use not only the $N_2$ gas but also a rare gas such as an Ar gas, a He gas, a Ne gas, a Xe gas, or the like.

(Performing a Second Set a Predetermined Number of Times)

By performing one set (a second set) including the aforementioned steps 4 and 5 a predetermined number of times ($m_2$ times), namely by alternately performing steps 4 and 5 one or more times, a second film, i.e., a SiBN film having a predetermined composition and a predetermined thickness and containing a borazine ring skeleton, can be formed on the borazine-ring-skeleton-free SiBN film (the first film). The second film contains a borazine ring skeleton and, therefore, becomes a porous film. The second film may be referred to as a thin film which contains Si, C and a borazine ring skeleton. At this time, the number of times the second set is performed is controlled such that the thickness of the second film becomes. e.g., 0.1 nm or more and 5 nm or less, or specifically, e.g., 0.1 nm or more and 1 nm or less. The second set is performed, e.g., one or more times and 50 times or less, or specifically, e.g., one or more times and 10 times or less. Similar to the first film forming process, the second set may be repeated a plurality of times within the aforementioned range.

At this time, by controlling the processing conditions such as the internal pressure of the process chamber 201, the gas supply time and the like at the respective steps, it is possible to adjust the ratio of respective element components, namely a Si component, a B component, a C component, and an N component, in the SiBCN film formed at Step 5. That is to say, it is possible to adjust a Si concentration, a B concentration, a C concentration, and an N concentration in the SiBCN film. This makes it possible to control the composition ratio of the second film.

(Performing a Cycle a Predetermined Number of Times)

By performing one cycle including the first film forming process and the second film forming process a predetermined number of times (n times), namely by alternately performing the first film forming process and the second film forming process one or more times, a laminated film (hereinafter referred to as a nano-laminated film) obtained by alternately laminating the borazine-ring-skeleton-free SiBN film (the first film) and the borazine-ring-skeleton-containing SiBCN (the second film) at a nanoscale thickness can be formed on the wafer 200. The laminated film as a whole becomes a film which contains a borazine ring skeleton and which contains Si, B, C and N, namely a SiBCN film which contains a borazine ring skeleton.

(Purge and Return to Atmospheric Pressure)

The valves 243g to 243i are opened. A $N_2$ gas is supplied into the process chamber 201 from each of the gas supply pipes 232g to 232j and is exhausted from the exhaust pipe 231. The $N_2$ gas serves as a purge gas. Thus, the interior of the process chamber 201 is purged and the residual gas or the reaction byproduct remaining in the process chamber 201 is removed from the interior of the process chamber 201 (purge). Thereafter, the internal atmosphere of the process chamber 201 is substituted with the inert gas (inert gas substitution), and the internal pressure of the process chamber 201 returns to a normal pressure (return to an atmospheric pressure).

(Boat Unloading and Wafer Discharge)

The seal cap 219 is moved down by the boat elevator 115 to open the lower end of the reaction tube 203. The processed wafer 200 supported by the boat 217 is unloaded from the lower end of the reaction tube 203 to the outside of the reaction tube 203 (boat loading). Thereafter, the processed wafer 200 is discharged from the boat 217 (wafer discharge).

(3) EFFECTS ACCORDING TO THE PRESENT EMBODIMENT

According to the present embodiment, one or more effects set forth below may be achieved.

(a) By alternately laminating the first film and the second film, it becomes possible to improve the controllability of the composition ratio of the laminated film, i.e., the finally-formed SiBCN film.

More specifically, the ratio of the B component to the N component contained in the second film formed using the HCDS gas and the TMB gas (hereinafter referred to as a B/N ratio) is determined by the ratio of the number of B atoms contained in one molecule of the TMB gas to the number of N atoms contained in one molecule of the TMB gas (1/1 in the TMB gas), namely, determined by the kind of the gas which contains a borazine ring skeleton. It is difficult to control the B/N ratio so as to largely deviate from the ratio of the number of B atoms to the number of N atoms. In contrast, the B/N ratio of the first film formed through the use of the HCDS gas, the $BCl_3$ gas and the $NH_3$ gas can be appropriately controlled by adjusting the flow rate ratio of the $BCl_3$ gas to the $NH_3$ gas. Accordingly, if the B/N ratio is set differently in the first film and the second film when alternately laminating the first film and the second film, it is possible to control the B/N ratio of the finally-formed SiBCN film so as to have an arbitrary value between the B/N ratio of the first film and the B/N ratio of the second film.

By alternately laminating the first film (SiBN film) not containing C and the second film (SiBCN film) containing C, it is possible to control the C concentration in the finally-formed SiBCN film so as to become an arbitrary concentration which is lower than the C concentration in the second film. By controlling the ratio of the thickness of the first film to the thickness of the second film, it is possible to finely adjust the Si concentration, the B concentration, the C concentration and the N concentration in the finally-formed SiBCN film.

As set forth above, by alternately laminating the first film and the second film, it is possible to control the composition ratio of the finally-formed SiBCN film so as to have a value which may not be obtained in a case where a single film is formed using the HCDS gas, the $BCl_3$ gas and the $NH_3$ gas or in a case where a single film is formed using the HCDS gas and the TMB gas. That is to say, it becomes possible to broaden a composition ratio control window.

(b) By alternately laminating the first film and the second film, it is possible to improve the controllability of the density of the finally-formed SiBCN film, i.e., the in-film atom density. As a result, it becomes possible to improve the controllability of the dielectric constant of the finally-formed SiBCN film. More specifically, the borazine-ring-skeleton-containing second film (porous film) becomes a film which is lower in the in-film atom density and the dielectric constant than the borazine-ring-skeleton-free first film (non-porous film). Thus, by alternately laminating the first film and the second film, it is possible to control the dielectric constant of the finally-formed SiBCN film so as to have, e.g., an arbitrary value between the dielectric constant of the borazine-ring-skeleton-free SiBN film (single film) formed using the HCDS gas, the $BCl_3$ gas and the $NH_3$ gas and the dielectric constant of the borazine-ring-skeleton-containing SiBCN film (single film) formed using the HCDS gas and the TMB gas. That is to say, by alternately laminating the first film and the second film, it is possible to control the dielectric constant of the finally-formed SiBCN film so as to have a value which may not be obtained in a case where a single film is formed using the HCDS gas, the $BCl_3$ gas and the $NH_3$ gas or in a case where a single film is formed using the HCDS gas and the TMB gas. This makes it possible to broaden a dielectric constant control window. Furthermore, by controlling the ratio of the thickness of the first film to the thickness of the second film, it is possible to finely adjust the dielectric constant of the finally-formed SiBCN film.

(c) By alternately laminating the first film and the second film, it is possible to improve the surface roughness of the finally-formed SiBCN film. The term "surface roughness" means the height difference in a wafer surface or in an arbitrary object surface. The surface roughness may have the same meaning as the surface coarseness. By stating that the surface roughness is improved (good), it is meant that the height difference is reduced (small), namely that the surface is smoothened (smooth). By stating that the surface roughness is worsened (poor), it is meant that the height difference is increased (large), namely that the surface is roughened (rough). There is a tendency that the borazine-ring-skeleton-free first film becomes better in surface roughness than the borazine-ring-skeleton-containing second film. Thus, by alternately laminating the first film and the second film, it becomes possible to improve the surface roughness of the finally-formed SiBCN film. That is to say, by alternately laminating the first film and the second film, it is possible to make the surface roughness of the finally-formed SiBCN film higher than the surface roughness of the borazine-ring-skeleton-containing SiBCN film (single film) formed using the HCDS gas and the TMB gas.

At this time, if the formation of the borazine-ring-skeleton-free first film is performed prior to the formation of the borazine-ring-skeleton-containing second film, it is possible to further improve the surface roughness of the finally-formed SiBCN film. That is to say, if the first film having good surface roughness is formed as a base of the second film prior to forming the second film and then the second film is formed on the first film, the second film is affected by the base. This makes it possible to improve the surface roughness of the second film. As a result, it becomes possible to further improve the surface roughness of the finally-formed SiBCN film.

At this time, if the borazine-ring-skeleton-free first film is finally formed, it becomes possible to further improve the surface roughness of the finally-formed SiBCN film. That is to say, if the uppermost portion of the finally-formed SiBCN film, i.e., the laminated film, is configured by the first film having good surface roughness, it becomes possible to further improve the surface roughness of the finally-formed SiBCN film.

(d) By alternately laminating the first film and the second film, it is possible to improve the controllability of the oxidation resistance of the finally-formed SiBCN film. More specifically, the borazine-ring-skeleton-containing second film contains boron (B) as one constituent element in the borazine ring skeleton constituting the second film. As described above, the B—N bond constituting the borazine ring skeleton is strong. For that reason, the second film is smaller in desorption of B from the film by oxidation than the first film. Thus, the second film becomes a film which is high in oxidation resistance, e.g., in the resistance to oxygen plasma, namely a film having the high ashing resistance. By alternately laminating the first film and the second film, it is possible to control the oxidation resistance of the finally-formed SiBCN film so as to have, e.g., an arbitrary characteristic between the first film and the second film. That is to say, by alternately laminating the first film and the second film, it is possible to control the oxidation resistance of the finally-formed SiBCN film so as to have a characteristic which cannot be realized in a case where a single film is formed using the HCDS gas, the $BCl_3$ gas and the $NH_3$ gas or in a case where a single film is formed using the HCDS gas and the TMB gas. This makes it possible to broaden a window of oxidation resistance control, i.e., ashing resistance control.

(e) As described above, by alternately laminating the first film and the second film, it is possible to have the finally-formed SiBCN film become a film having the characteristics of one or both of the first film and the second film, or a film having the intermediate characteristics between the first film and the second film, or a film having the characteristics differing from those of the first film and the second film. In this case, as described above, the thickness of each of the first film and the second film may be, e.g., 0.1 nm or more and 5 nm or less, or specifically, e.g., 0.1 nm or more and 1 nm or less.

It is difficult to form each of the first film and the second film to have a thickness of less than 0.1 nm. Furthermore, if the thickness of one of the first film and the second film exceeds 5 nm, it is sometimes the case that the finally-formed SiBCN film becomes a film having non-uniform (inconsistent) characteristics in the lamination direction, namely a film having isolated characteristics in the lamination direction due to the mere lamination of the first film and the second film. By setting the thickness of each of the first film and the second film to become 0.1 nm or more and 5 nm or less, or specifically, e.g., 0.1 nm or more and 1 nm or less, it is possible to have the finally-formed SiBCN film become a film having consistent characteristics in the lamination direction, namely a film in which the characteristics and properties of the first film and the second film are properly fused. That is to say, by setting the thickness of each of the first film and the second film to fall within the aforementioned range, it is possible to have the finally-formed SiBCN film become a nano-laminated film having integral characteristics as a whole of the film. Moreover, by setting the number of performing times of each of the aforementioned sets ($m_1$ times or $m_2$ times) to become one or more times and 50 times or less, or specifically, e.g., one or more times and 10 times or less, it is possible to have the thickness of each of the first film and the second film fall within the aforementioned range. As the thickness of each of the first film and the second film is set smaller, namely as the number of performing times of each of the aforementioned sets ($m_1$ times or $m_2$ times) is set smaller, it is possible to improve the surface roughness of the finally-formed SiBCN film.

(f) If a precursor gas having high adsorptivity, such as the HCDS gas or the like, is used when forming the first film and the second film, it is possible to efficiently perform the formation of the respective films. As a result, it becomes possible to increase the deposition rate of the finally-formed SiBCN film. It is also possible to reduce consumption of the precursor gas not contributing to film formation, thereby reducing the film formation cost.

(g) If a precursor gas containing two Si atoms in one molecule, such as the HCDS gas or the like, is used when forming the first film and the second film, it is possible to have the finally-formed SiBCN film become a film in which Si atoms contained in the film adjoin each other. More specifically, when the first layer or the fourth layer is formed under a condition in which the HCDS gas is not autolyzed, two Si atoms contained in an HCDS gas molecule are adsorbed onto the wafer 200 (the base film of the surface) in a mutually adjoining state. Furthermore, when the first layer or the fourth layer is formed under a condition in which the HCDS gas is autolyzed, two Si atoms contained in an HCDS gas molecule have a strong tendency to be deposited on the wafer 200 in a mutually adjoining state. If a precursor gas containing two Si atoms in one molecule, such as the HCDS gas or the like, is used as mentioned above, the Si atoms contained in the first layer or the fourth layer can be kept in a mutually adjoining state, which is not possible in a case of using a gas containing only one Si atom in one molecule, such as a dichlorosilane ($SiH_2Cl_2$, abbreviation: DCS) gas or the like. As a result, it is possible to have the first film or the second film, namely the finally-formed SiBCN film, become a film in which Si atoms adjoin each other. This makes it possible to improve the HF resistance of the film.

(h) If different kinds of gases are supplied non-simultaneously or alternately when forming the first film and the second film, it is possible to allow the gases to react under a condition in which a surface reaction is dominant. As a result, it is possible to improve the step coverage of the finally-formed SiBCN film and the controllability of the film thickness. It is also possible to avoid an excessive gas-phase reaction otherwise occurring in the process chamber 201 and to suppress generation of particles.

(4) MODIFIED EXAMPLES

The film forming sequence according to the present embodiment is not limited to the example illustrated in FIG. 4A but may be modified as in the modified examples described below.

Modified Example 1

Figure 4B:
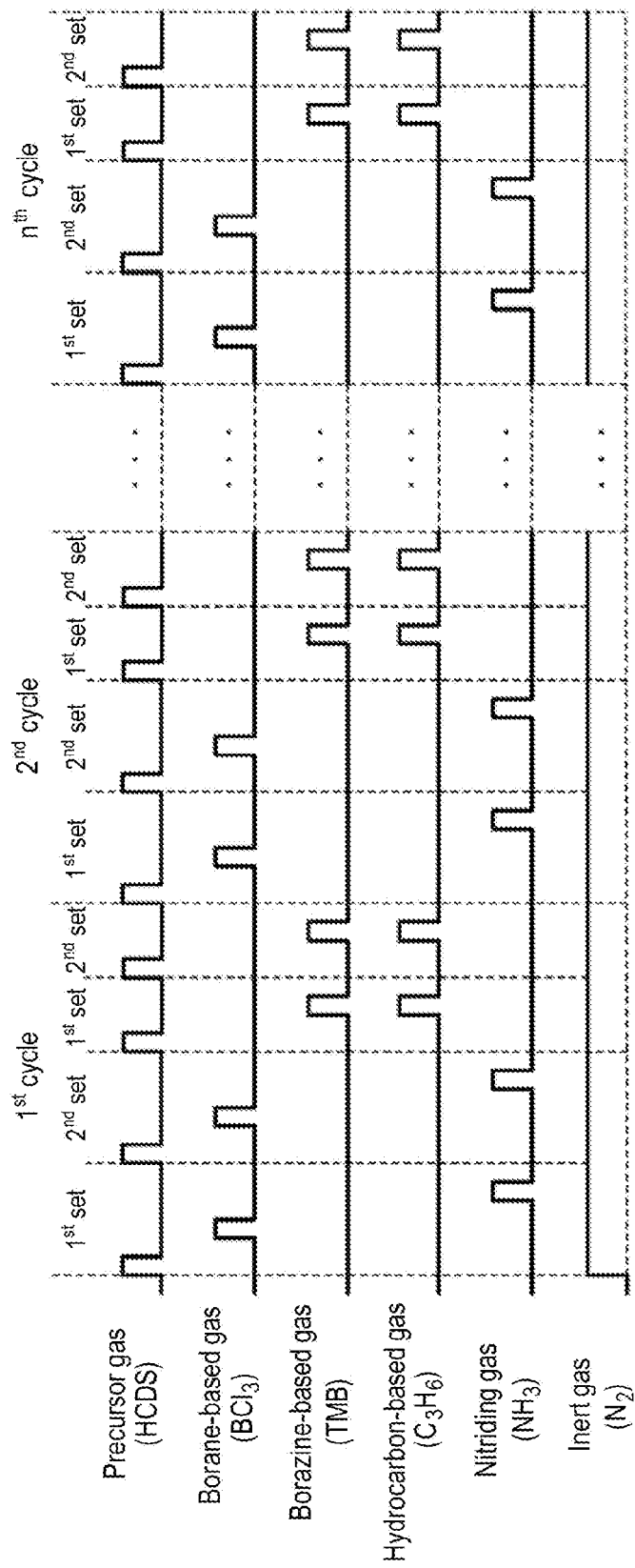
FIG. 4B is a view showing a first modified example thereof.

When forming the second film, a step of supplying a carbon-containing gas, e.g., a $C_3H_6$ gas, to the wafer 200 may be performed at the timing of a modified example shown in FIG. 4B. That is to say, the step of supplying the $C_3H_6$ gas may be performed simultaneously with Step 5 of supplying the TMB gas.

At the step of supplying the $C_3H_6$ gas, which is performed simultaneously with Step 5, the opening/closing control of the valve 243e is performed in the same or similar manner as the opening/closing control of the valve 243a performed at Step 1. The supply flow rate of the $C_3H_6$ gas controlled by the MFC 241e is set to fall within a range of, e.g., 100 to 10,000 sccm. The internal pressure of the process chamber 201 is set to fall within a range of, e.g., 1 to 5,000 Pa, or specifically, e.g., 1 to 4,000 Pa. The partial pressure of the $C_3H_6$ gas within the process chamber 201 is set to fall within a range of, e.g., 0.01 to 4,950 Pa. The time during which the $C_3H_6$ gas is supplied to the wafer 200, namely the gas supply time (irradiation time), is set to fall within a range of, e.g., 1 to 200 seconds, specifically, e.g., 1 to 120 seconds, or more specifically, e.g., 1 to 60 seconds. Other processing conditions may be the same as, e.g., the processing conditions of Step 5 of the film forming sequence illustrated in FIG. 4A. As the carbon-containing gas, it may be possible to use not only the $C_3H_6$ gas but also, e.g., a hydrocarbon-based gas such as an acetylene $(C_2H_2)$ gas, an ethylene $(C_2H_4)$ gas, or the like.

According to this modified example, there are provided the same or similar effects as achieved in the film forming sequence illustrated in FIG. 4A. In addition, when forming the second film, the $C_3H_6$ gas is supplied to the wafer 200 under the aforementioned conditions, whereby not only the C component which was contained in the TMB gas but also the C component which was contained in the $C_3H_6$ gas can be added to the second film. In this way, two kinds of C sources (double carbon sources) are used when forming the second film. It is therefore possible to make the C concentration in the second film higher than that available in the film forming sequence illustrated in FIG. 4A. As a result, it is possible to increase the C concentration in the finally-formed SiBCN film. This makes it possible to have the finally-formed SiBCN film become a C-rich layer. Moreover, a gas not containing N, such as the $C_3H_6$ gas or the like, namely a hydrocarbon-based gas not serving as an N source, is used as the carbon-containing gas. It is therefore possible to prevent an N component derived from the carbon-containing gas from being added to the second film. This makes it possible to increase the C concentration in the finally-formed SiBCN film while suppressing an increase of the N concentration in the finally-formed SiBCN film.

Furthermore, according to this modified example, the step of supplying the $C_3H_6$ gas is performed simultaneously with Step 5. Thus, the time required in one cycle does not increase. This makes it possible to maintain the productivity of the film forming process.

Modified Example 2

When forming the first film, as shown in FIG. 5A, at Step 3, a gas containing N and C, e.g., a TEA gas, may be supplied instead of the $NH_3$ gas.

At the step of supplying the TEA gas, the opening/closing control of the valve 243d is performed in the same or similar manner as the opening/closing control of the valve 243a performed at Step 1. The supply flow rate of the TEA gas controlled by the MFC 241d is set to fall within a range of, e.g., 100 to 10,000 sccm. The internal pressure of the process chamber 201 is set to fall within a range of, e.g., 1 to 5,000 Pa, or specifically, e.g., 1 to 4,000 Pa. The partial pressure of the TEA gas within the process chamber 201 is set to fall within a range of, e.g., 0.01 to 4,950 Pa. The time during which the TEA gas is supplied to the wafer 200, namely the gas supply time (irradiation time), is set to fall within a range of, e.g., 1 to 200 seconds, specifically, e.g., 1 to 120 seconds, or more specifically, e.g., 1 to 60 seconds. Other processing conditions may be the same as, e.g., the processing conditions of Step 3 of the film forming sequence illustrated in FIG. 4A.

By supplying the TEA gas to the wafer 200 under the aforementioned conditions, it is possible to allow the second layer formed on the wafer 200 to react with the TEA gas, thereby modifying the second layer. At this time, the N component and the C component contained in the TEA gas are added to the second layer, whereby a third layer containing Si, B, C and N, namely a SiBCN layer, is formed on the wafer 200. The third layer becomes a borazine-ring-skeleton-free layer. Then, similar to the film forming sequence illustrated in FIG. 4A, the first set is performed a predetermined number of times, whereby a first film, i.e., a borazine-ring-skeleton-containing SiBCN film, is formed on the wafer 200.

As the gas containing N and C, it may be possible to use not only the TEA gas but also, e.g., an ethylamine-based gas such as a diethylamine $((C_2H_5)_2NH$, abbreviation: DEA) gas, a monoethylamine $(C_2H_5NH_2$, abbreviation: MEA) gas or the like, a methylamine-based gas such as a trimethylamine $((CH_3)_3N$, abbreviation: TMA) gas, a dimethylamine $((CH_3)_2NH$, abbreviation: DMA) gas, a monomethylamine $(CH_3NH_2$, abbreviation: MMA) gas or the like, a propylamine-based gas such as a tripropylamine $((C_3H_7)_3N$, abbreviation: TPA) gas, a dipropylamine $((C_3H_7)_2NH$, abbreviation: DPA) gas, a monopropylamine $(C_3H_7NH_2$, abbreviation: MPA) gas or the like, an isopropylamine-based gas such as a triisopropylamine $([(CH_3)_2CH]_3N$, abbreviation: TIPA) gas, a diisopropylamine $([(CH_3)_2CH]_2NH$, abbreviation: DIPA) gas, a monoisopropylamine $((CH_3)_2CHNH_2$, abbreviation: MIPA) gas or the like, a butylamine-based gas such as a tributylamine $(C_4H_9)_3N$, abbreviation: TBA) gas, a dibutylamine $((C_4H_9)_2NH$, abbreviation: DBA) gas, a monobutylamine $(C_4H_9NH_2$, abbreviation: MBA) gas or the like, and an isobutylamine-based gas such as a triisobutylamine $([(CH_3)_2CHCH_2]_3N$, abbreviation: TIBA) gas, a diisobutylamine $([(CH_3)_2CHCH_2]_2NH$, abbreviation: DIBA) gas, a monoisobutylamine $((CH_3)_2CHCH_2NH_2$, abbreviation: MIBA) gas or the like. That is to say, as the amine-based gas, it may be possible to use, for example, at least one of the gases expressed by the composition formulae: $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (where x is an integer of from 1 to 3) may be used as the amine-based gas. In order to increase the C concentration while suppressing an increase of the N concentration in the first film, i.e., the finally-formed SiBCN film, a gas having a molecule in which the number of C atoms is larger than the number of N atoms may be used as the amine-based gas. That is to say, as the amine-based gas, a gas which contains at least one amine selected from a group consisting of TEA, DEA, MEA, TMA, DMA, TPA, DPA, MPA, TIPA, DIPA, MIPA, TBA, DBA, MBA, TIBA, DIBA and MIBA may be used.

As the gas containing N and C, it may be possible to use not only the amine-based gas but also, e.g., an organic hydrazine-based gas. In this regard, the organic hydrazine-based gas refers to gaseous organic hydrazine (compound), for example, a gas which is obtained by vaporizing organic hydrazine remaining in a liquid state under a normal temperature and a normal pressure or a gas which contains a hydrazine group, such as organic hydrazine or the like remaining in a gaseous state under a normal temperature and a normal pressure. The organic hydrazine-based gas may be simply referred to as an organic hydrazine gas or an organic hydrazine compound gas. The organic hydrazine-based gas is a Si-free gas composed of three elements, C, N and H, and is a gas which does not contain Si and metal. As the organic hydrazine-based gas, it may be possible to use, for example, a methylhydrazine-based gas such as a monomethylhydrazine $((CH_3)HN_2H_2$, abbreviation: MMH) gas, a dimethylhydrazine $((CH_3)_2N_2H_2$, abbreviation: DMH) gas, a trimethylhydrazine $((CH_3)N_2(CH_3)H$, abbreviation; TMH) gas or the like, and an ethylhydrazine-based gas such as an ethylhydrazine $((C_2H_5)HN_2H_2$, abbreviation: EH) gas or the like. In order to increase the C concentration while suppressing an increase of the N concentration in the first film, i.e., the finally-formed SiBCN film, a gas having a molecule in which the number of C atoms is larger than the number of N atoms may be used as the organic hydrazine-based gas.

As the amine-based gas or the organic hydrazine-based gas, a gas having a plurality of C-containing ligands in one molecule, namely a gas having a plurality of hydrocarbon groups such as alkyl groups or the like in one molecule may be used. More specifically, as the amine-based gas or the organic hydrazine-based gas, a gas having three or two C-containing ligands (hydrocarbon groups such as alkyl groups or the like). i.e., organic ligands, in one molecule may be used.

According to this modified example, there are provided the same or similar effects as achieved in the film forming sequence illustrated in FIG. 4A. In addition, when forming the first film, at Step 3, the TEA gas is supplied in place of the $NH_3$ gas, whereby not only the N component but also the C component can be added to the first film. That is to say, not only the C component which was contained in the TMB gas but also the C component which was contained in the TEA gas can be added to the finally-formed SiBCN film. In this way, during one cycle including the first film forming process and the second film forming process, film formation is performed using two kinds of C sources (double carbon sources). It is therefore possible to make the C concentration in the film higher than that available in the film forming sequence illustrated in FIG. 4A.

Furthermore, according to this modified example, even when the SiBCN film rather than the SiBN film is formed as the first film, there is no need to add a step of supplying a carbon-containing gas such as a $CH_3H_6$ gas or the like in the first film forming process. Thus, the required time per one cycle does not increase. This makes it possible to maintain the productivity of the film forming process.

Modified Example 3

Figure 5B:
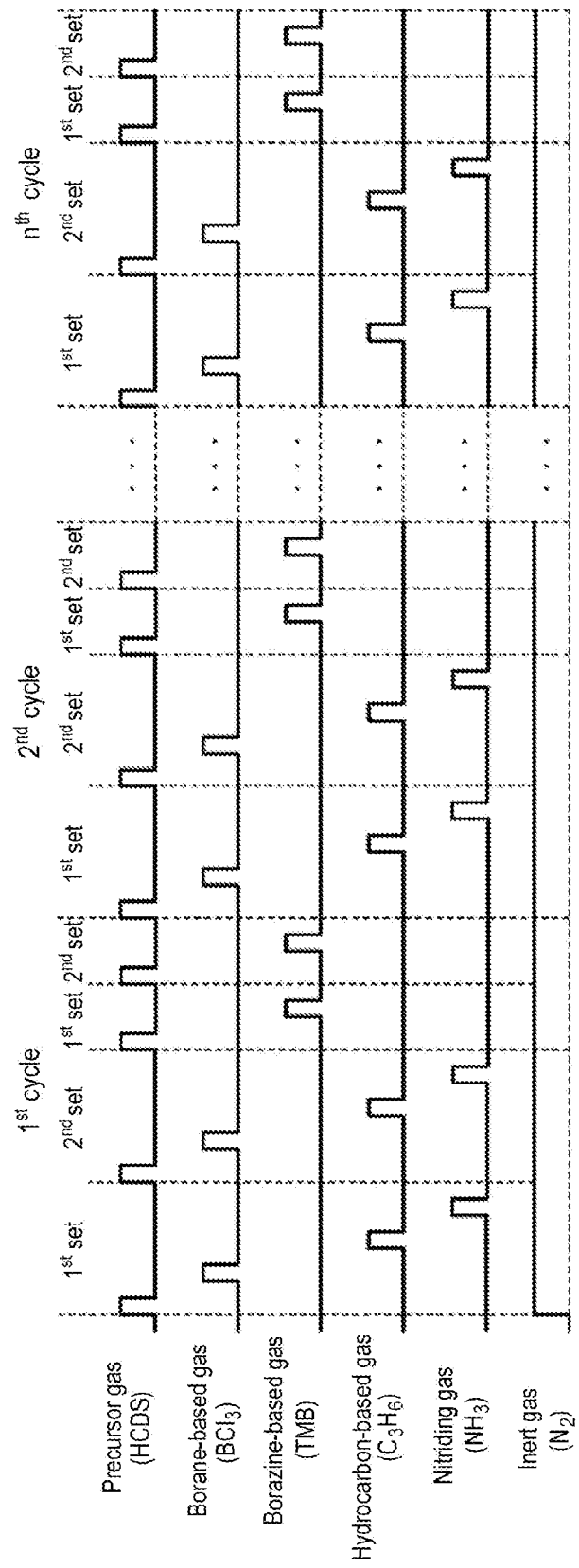

When forming the first film, a step of supplying a carbon-containing gas, e.g., a $C_3H_6$ gas, to the wafer 200 may be performed at the timing of a modified example shown in FIG. 5B. That is to say, the step of supplying the $C_3H_6$ gas may be performed prior to Step 3 of supplying the $NH_3$ gas. In other words, the $C_3H_6$ gas may be first supplied prior to supplying the $NH_3$ gas to the second layer formed at Step 2. The $C_3H_6$ gas is adsorbed onto at least a portion of the surface of the second layer. In this way, the step of supplying the $C_3H_6$ gas may be performed non-simultaneously with Step 3 of supplying the $NH_3$ gas. In this case, a SiBCN film is formed as the first film.

The step of supplying the $C_3H_6$ gas, which precedes Step 3, is performed by the same or similar processing procedures and processing conditions as those of the step of supplying the $C_3H_6$ gas illustrated in FIG. 4B, namely the step of supplying the $C_3H_6$ gas performed when forming the second film in modified example 1. As the carbon-containing gas, it may be possible to use not only the $C_3H_6$ gas but also, e.g., the aforementioned hydrocarbon-based gas.

According to this modified example, there are provided the same or similar effects as achieved in the film forming sequence illustrated in FIG. 4A. In addition, when forming the first film, the step of supplying the $C_3H_6$ gas to the wafer 200 is performed under the aforementioned conditions, whereby the C component which was contained in the $C_3H_6$ gas can be added to the first film, namely the finally-formed SiBCN film. That is to say, not only the C component which was contained in the TMB gas but also the C component which was contained in the $C_3H_6$ gas can be added to the finally-formed SiBCN film. In this way, during one cycle including the first film forming process and the second film forming process, film formation is performed using two kinds of C sources (double carbon sources). It is therefore possible to make the C concentration in the film higher than that available in the film forming sequence illustrated in FIG. 4A.

Furthermore, according to this modified example, when forming the first film, a gas not containing N, such as the $C_3H_6$ gas or the like, namely a hydrocarbon-based gas not serving as an N source, is used as the carbon-containing gas. It is therefore possible to prevent an N component derived from the carbon-containing gas from being added to the first film. This makes it possible to increase the C concentration while suppressing an increase of the N concentration in the finally-formed SiBCN film.

Moreover, according to this modified example, when forming the first film, the step of supplying the $C_3H_6$ gas is performed independently of Step 3 of supplying the $NH_3$ gas. Therefore, as compared with the modified example illustrated in FIG. 5A, it is possible to improve the controllability of the composition ratio of the SiBCN film. That is to say, the supply of the $C_3H_6$ gas serving as a C source and the supply of the $NH_3$ gas serving as an N source are independently performed such that the supply timings thereof do not overlap with each other. This makes it possible to freely set the processing conditions of the aforementioned steps. As a result, it is easy to increase the C concentration while suppressing an increase of the N concentration in the first film, i.e., the borazine-ring-skeleton-free SiBCN film. In order to reliably perform, at Step 3, the reaction between the second layer having the $C_3H_6$ gas adsorbed onto the surface thereof and the $NH_3$ gas, namely the formation of the SiBCN layer as a third layer, the step of supplying the $C_3H_6$ gas may be finished before the adsorption reaction of $C_3H_6$ gas molecules on the surface of the second layer is saturated, namely before the adsorption layer (chemical adsorption layer) of the $C_3H_6$ gas formed on the surface of the second layer becomes a continuous layer (during the time when the adsorption layer is a discontinuous layer).

Modified Example 4

Figure 6A:
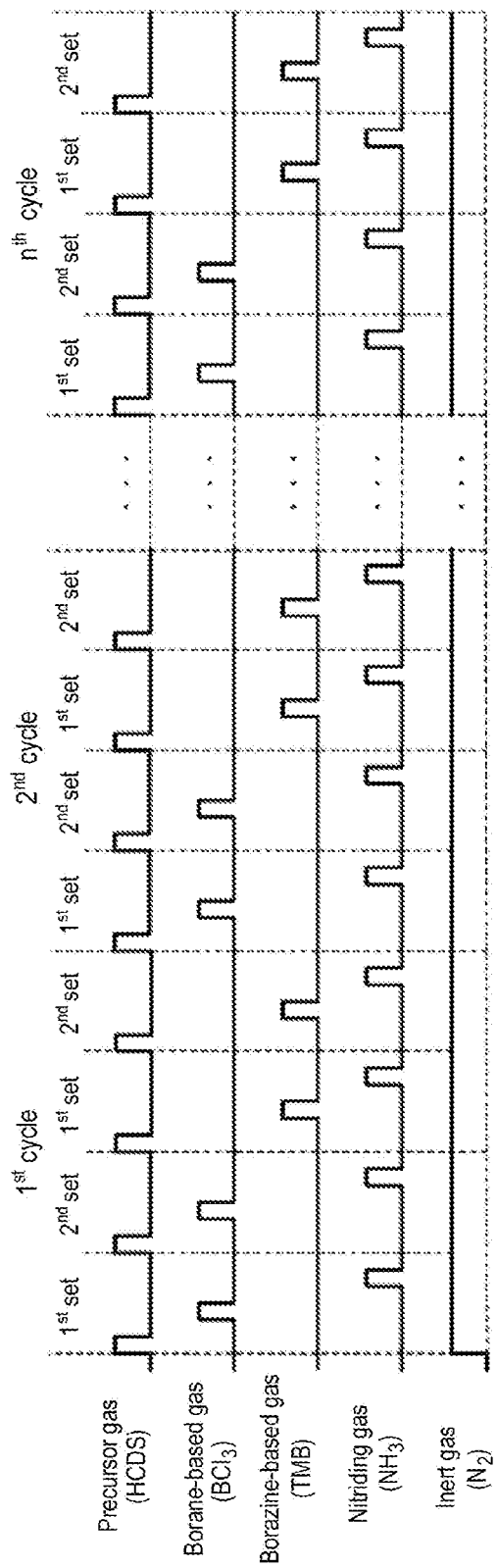

When forming the second film, the step of supplying the nitrogen-containing gas, e.g., the $NH_3$ gas, to the wafer 200 may be performed at the timing of a modified example illustrated in FIG. 6A. That is to say, the step of supplying the $NH_3$ gas may be performed after Step 5 of supplying the TMB gas. In other words, the $NH_3$ gas may be supplied to the fifth layer formed at Step 5.

The step of supplying the $NH_3$ gas, which is performed after Step 5, may be performed by the same or similar processing procedures and processing conditions as, e.g., those of Step 3 performed when forming the first film. As the nitrogen-containing gas, it may be possible to use not only the $NH_3$ gas but also, e.g., the aforementioned hydrogen nitride-based gas.

By supplying the $NH_3$ gas to the wafer 200, i.e., the fifth layer, under the aforementioned conditions, it is possible to allow the fifth layer formed on the first film to react with the $NH_3$ gas, thereby nitriding (modifying) at least a portion of the fifth layer. By virtue of the nitriding, nitrogen is further added to the fifth layer, whereby at least a portion of the C atoms contained in the fifth layer can be desorbed from the fifth layer. At this time, for example, if the internal pressure of the process chamber 201 is increased to thereby increase the nitriding power, it is possible to desorb most of the C atoms contained in the fifth layer such that the C atoms exist at an impurity level. It is also be possible to substantially extinguish the C atoms contained in the fifth layer. As the fifth layer is modified, a borazine-ring-skeleton-containing N-rich (C-poor) SiBCN layer or a borazine-ring-skeleton-containing SiBN layer is formed on the first film.

At this time, by supplying the $NH_3$ gas under the aforementioned conditions, it is possible to generate the series of reactions described above while maintaining the borazine ring skeleton contained in the fifth layer without destroying the same. The most important factors for generating the series of reactions while maintaining the borazine ring skeleton contained in the fifth layer are considered to be the temperature of the wafer 200 and the internal temperature of the process chamber 201, particularly the temperature of the wafer 200. By appropriately controlling the temperature of the wafer 200 and the internal temperature of the process chamber 201, it becomes possible to generate a suitable reaction.

At this time, the impurity such as Cl or the like contained in the fifth layer forms a gaseous substance containing at least Cl in the course of the modification reaction of the fifth layer generated by the $NH_3$ gas. The substance thus formed is exhausted from the interior of the process chamber 201. Thus, the modified fifth layer becomes a layer which is smaller in the amount of the impurity such as Cl or the like than the unmodified fifth layer.

Thereafter, just like the film forming sequence illustrated in FIG. 4A, the second set is performed a predetermined number of times, whereby a second film, i.e., a borazine-ring-skeleton-containing N-rich (C-poor) SiBCN film or a borazine-ring-skeleton-containing SiBN film is formed on the first film. The finally-formed laminated film (nano-laminated film) composed of the first film and the second film alternately laminated one above the other becomes a borazine-ring-skeleton-containing SiBCN film or a borazine-ring-skeleton-containing SiBN film.

According to this modified example, there are provided the same or similar effects as achieved in the film forming sequence illustrated in FIG. 4A. In addition, it is possible to have the second film become an N-rich (C-poor) SiBCN film or a SiBN film. This makes it possible to further broaden the window for the control of the composition ratio of the finally-formed film. Moreover, due to the supply of the $NH_3$ gas, the impurity such as Cl or the like is further desorbed from the fifth layer. It is therefore possible to further reduce the impurity concentration in the finally-formed film and to further increase the HF resistance of the film.

Modified Example 5

When forming the second film, the step of supplying the gas containing N and C, e.g., the TEA gas, to the wafer 200 may be performed at the timing of a modified example illustrated in FIG. 6B. That is to say, the step of supplying the TEA gas may be performed after Step 5 of supplying the TMB gas. In other words, the TEA gas may be supplied to the fifth layer formed at Step 5.

The step of supplying the TEA gas, which is performed after Step 5, may be performed by the same or similar processing procedures and processing conditions as, e.g., those of Step 3 of modified example 2 illustrated in FIG. 5A, namely step 3 performed when forming the first film in modified example 2. As the gas containing N and C, it may be possible to use not only the TEA gas but also different kinds of amine-based gases or organic hydrazine-based gases mentioned above.

By supplying the TEA gas to the wafer 200, i.e., the fifth layer, under the aforementioned conditions, it is possible to allow the fifth layer formed on the first film to react with the TEA gas, thereby modifying the fifth layer. At this time, the N component and the C component which were contained in the TEA gas are added to the fifth layer, whereby a borazine-ring-skeleton-containing N-rich and C-rich SiBCN layer is formed on the first film.

At this time, by supplying the TEA gas under the aforementioned conditions, it is possible to generate the series of reactions described above while maintaining the borazine ring skeleton contained in the fifth layer without destroying the same. Most important factors for generating the series of reactions while maintaining the borazine ring skeleton contained in the fifth layer are considered to be the temperature of the wafer 200 and the internal temperature of the process chamber 201, particularly the temperature of the wafer 200. By appropriately controlling the temperature of the wafer 200 and the internal temperature of the process chamber 201, it becomes possible to generate a suitable reaction.

Thereafter, just like the film forming sequence illustrated in FIG. 4A, the second set is performed a predetermined number of times, whereby a second film, i.e., a borazine-ring-skeleton-containing N-rich and C-rich SiBCN film is formed on the first film.

According to this modified example, there are provided the same or similar effects as achieved in the film forming sequence illustrated in FIG. 4A. In addition, it is possible to have the second film become an N-rich and C-rich SiBCN film or a SiBN film. That is to say, not only the N component and the C component which were contained in the TMB gas but also the C component and the N component which were contained in the TEA gas can be added to the second film. This makes it possible to further broaden the window for the control of the composition ratio of the finally-formed SiBCN.

Modified Examples 6 to 9

The film forming sequence illustrated in FIG. 4A and the film forming sequences of modified examples 1 to 5 described above may be arbitrarily combined.

Figure 7B:
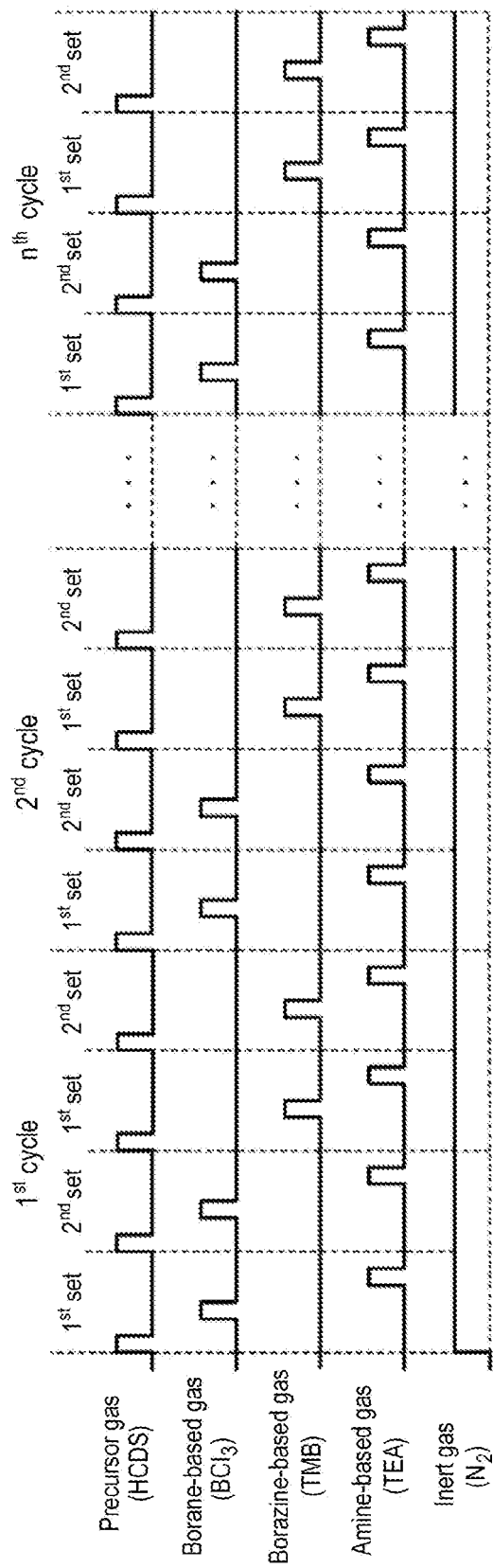

For example, as in modified example 6 illustrated in FIG. 7A, the film forming sequence of the first film forming process of modified example 2 illustrated in FIG. 5A and the film forming sequence of the second film forming process of modified example 4 illustrated in FIG. 6A may be combined with each other and may be performed as one cycle. In addition, for example, as in modified example 7 illustrated in FIG. 7B, the film forming sequence of the first film forming process of modified example 2 illustrated in FIG. 5A and the film forming sequence of the second film forming process of modified example 5 illustrated in FIG. 6B may be combined with each other and may be performed as one cycle.

Figure 8A:
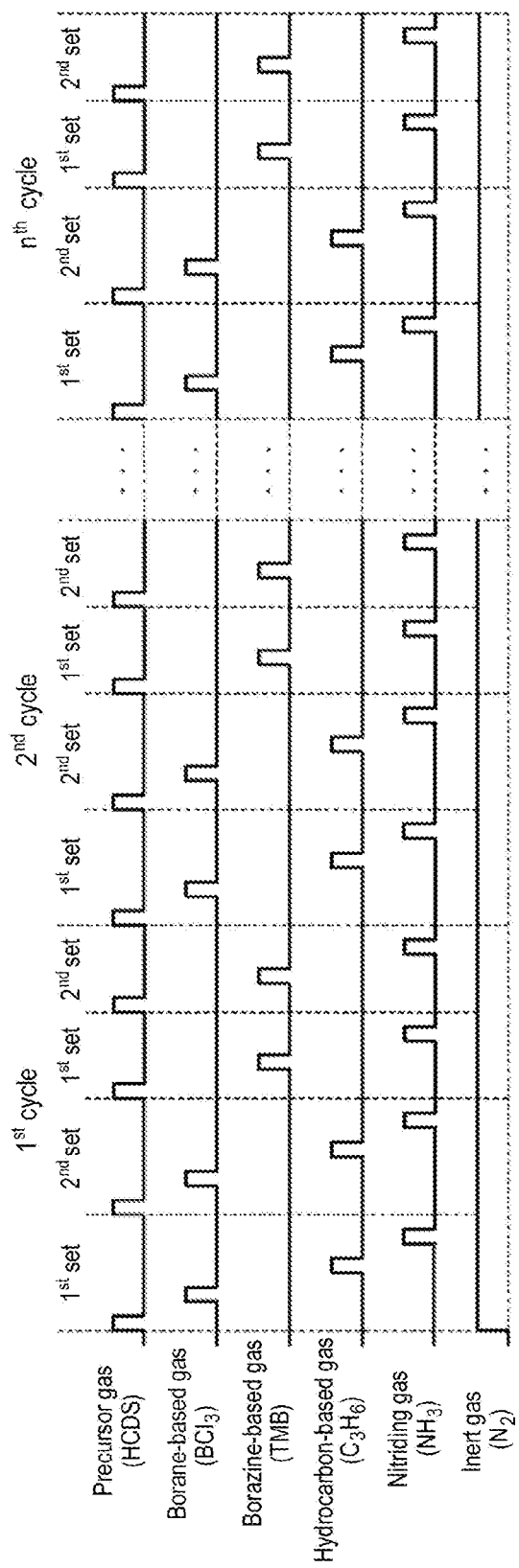

Moreover, for example, as in modified example 8 illustrated in FIG. 8A, the film forming sequence of the first film forming process of modified example 3 illustrated in FIG. 5B and the film forming sequence of the second film forming process of modified example 4 illustrated in FIG. 6A may be combined with each other and may be performed as one cycle. Additionally, for example, as in modified example 9 illustrated in FIG. 8B, the film forming sequence of the first film forming process of modified example 3 illustrated in FIG. 5B and the film forming sequence of the second film forming process of modified example 3 illustrated in FIG. 6B may be combined with each other and may be performed as one cycle.

According to these modified examples, there are provided the same or similar effects as achieved in the film forming sequence illustrated in FIG. 4A or the film forming sequences of modified examples 1 to 5 described above.

For example, the step of supplying the carbon-containing gas, e.g., the $C_3H_6$ gas, may be performed simultaneously with Step 5 of supplying the TMB gas as in modified example 1 illustrated in FIG. 4B or may be performed at the timing which differs from the timing of Step 5. Furthermore, the step of supplying the $C_3H_6$ gas may be performed non-simultaneously with, namely prior to Step 3 of supplying the $NH_3$ gas, as in modified example 3 illustrated in FIG. 5B or may be performed at the timing which differs from the timing of Step 3. Moreover, the step of supplying the $C_3H_6$ gas may be performed at an arbitrary timing in the film forming sequence illustrated in FIG. 4A or the film forming sequences of modified examples 1 to 5 described above.

For example, the step of supplying the $C_3H_6$ gas may be performed simultaneously with at least one of the step of supplying the TMB gas, the step of supplying the $BCl_3$ gas, the step of supplying the TEA gas, the step of supplying the HCDS gas, and the step of supplying the $NH_3$ gas. According to this modified example, there are provided the same or similar effects as achieved in modified example 1 illustrated in FIG. 4B. However, the $C_3H_6$ gas may be supplied not simultaneously with the HCDS gas but simultaneously with the TMB gas, the $BCl_3$ gas, the TEA gas or the $NH_3$ gas. By doing so, it becomes possible to avoid a vapor-phase reaction of the $C_3H_6$ gas otherwise generated in the process chamber 201 and to suppress generation of particles in the process chamber 201. Furthermore, the $C_3H_6$ gas may be supplied not simultaneously with the $BCl_3$ gas or the $NH_3$ gas but simultaneously with the TMB gas or the TEA gas. By doing so, it becomes possible to increase the controllability of the composition ratio of the resultant film.

As another example, the step of supplying the $C_3H_6$ gas may be performed non-simultaneously with at least one of the step of supplying the TMB gas, the step of supplying the $BCl_3$ gas, the step of supplying the TEA gas, the step of supplying the HCDS gas, and the step of supplying the $NH_3$ gas. For instance, the supply of the $C_3H_6$ gas may be performed before or after the supply of the TMB gas, the $BCl_3$ gas, the TEA gas, the HCDS gas or the $NH_3$ gas. That is to say, the gas supply may be performed such that the supply timings (supply periods) of the respective gases do not overlap with one another. According to this modified example, there are provided the same or similar effects as achieved in modified example 3 illustrated in FIG. 5B.

Additional Embodiments of the Present Disclosure

While one embodiment of the present disclosure has been described above, the present disclosure is not limited to the aforementioned embodiment but may be differently modified without departing from the spirit of the present disclosure.

For example, in the aforementioned embodiment, there has been described an example in which, when forming the first film, a boron-containing gas which does not contain a borazine ring skeleton is supplied after the supply of a precursor gas. Furthermore, there has been described an example in which, when forming the second film, a gas which contains a borazine ring skeleton is supplied after the supply of a precursor gas. The present disclosure is not limited to the aforementioned embodiment. These gases may be supplied in a reverse order. That is to say, the precursor gas may be supplied after the supply of the boron-containing gas which does not contain a borazine ring skeleton. The precursor gas may be supplied after the supply of the gas which contains a borazine ring skeleton. By changing the gas supply order in this way, it becomes possible to change the quality or the composition ratio of the resultant film.

As another example, in the aforementioned embodiment, there has been described an example in which, when forming the first film and the second film, the HCDS gas is used as the precursor gas, namely an example in which the same kind of precursor gas is used. The present disclosure is not limited to the aforementioned embodiment. The kind of the precursor gas used when forming the first film may differ from the kind of the precursor gas used when forming the second film. By changing the kind of the precursor gas in this way, it becomes possible to change the quality or the composition ratio of the resultant film.

As a further example, in the aforementioned embodiment, there has been described an example in which the second film is formed after forming the first film. The present disclosure is not limited to the aforementioned embodiment. The first film may be formed after forming the second film. However, as described above, it is preferred in some embodiments that the borazine-ring-skeleton-containing second film is formed after forming the borazine-ring-skeleton-free first film. By doing so, it becomes easy to improve the surface roughness of the finally-formed film.

If the silicon-based insulating film formed by the embodiment or the modified examples described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to the embodiment or some of the modified examples described above, it is possible to form a silicon-based insulating film having an ideal stoichiometric ratio without having to use plasma. Since the silicon-based insulating film can be formed without having to use plasma, it is possible to adapt to a process for forming, e.g., a SADP film of a DPT, in which plasma damage is worried about.

In the aforementioned embodiment, there has been described an example in which the silicon-based insulating film (the SiBCN film or the SiBN film) containing Si as a semiconductor element is formed as a borocarbonitride film or a boronitride film containing a predetermined element. The present disclosure is not limited to the aforementioned form but may be applied to, e.g., a case where a metal-based thin film containing a metal element such as titanium (Ti), zirconium (Zr), hafnium (Hf), tantalum (Ta), aluminum (Al), molybdenum (Mo) or the like is formed.

That is to say, the present disclosure may be suitably applied to, e.g., a case where a metal borocarbonitride film or a metal boronitride film, such as a TiBCN film, a TiBN film, a ZrBCN film, a ZrBN film, a HfBCN film, a HfBN film, a TaBCN film, a TaBN film, an AlBCN film, an AlBN film, a MoBCN film, a MoBN film or the like, is formed. In this case, instead of the Si-containing precursor gas used in the aforementioned embodiment, a precursor gas containing a metal element may be used as the precursor gas. Film formation can be performed by the same film forming sequence as used in the aforementioned embodiment.

In the case of forming the TiBCN film or the TiBN film, for example, a precursor gas containing Ti and a halogen element may be used as a Ti-containing precursor gas. As the precursor gas containing Ti and a halogen element, it may be possible to use, e.g., a precursor gas containing Ti and a chloro group, such as a titanium tetrachloride ($TiCl_4$) gas or the like, or a precursor gas containing Ti and a fluoro group, such as a titanium tetrafluoride ($TiF_4$) gas or the like. The same gases as used in the aforementioned embodiment may be used as a borazine-ring-skeleton-free boron-containing gas, a borazine-ring-skeleton-containing gas, a carbon-containing gas, a nitrogen-containing gas and a gas containing N and C. The processing conditions used in this case may be the same as those of the aforementioned embodiment.

In the case of forming the ZrBCN film or the ZrBN film, for example, a precursor gas containing Zr and a halogen element may be used as a Zr-containing precursor gas. As the precursor gas containing Zr and a halogen element, it may be possible to use, e.g., a precursor gas containing Zr and a chloro group, such as a zirconium tetrachloride ($ZrCl_4$) gas or the like, or a precursor gas containing Zr and a fluoro group, such as a zirconium tetrafluoride ($ZrF_4$) gas or the like. The same gases as used in the aforementioned embodiment may be used as a borazine-ring-skeleton-free boron-containing gas, a borazine-ring-skeleton-containing gas, a carbon-containing gas, a nitrogen-containing gas and a gas containing N and C. The processing conditions used in this case may be the same as those of the aforementioned embodiment.

In the case of forming the HfBCN film or the HfBN film, for example, a precursor gas containing Hf and a halogen element may be used as a Hf-containing precursor gas. As the precursor gas containing Hf and a halogen element, it may be possible to use, e.g., a precursor gas containing Hf and a chloro group, such as a hafnium tetrachloride ($HfCl_4$) gas or the like, or a precursor gas containing Hf and a fluoro group, such as a hafnium tetrafluoride ($HfF_4$) gas or the like. The same gases as used in the aforementioned embodiment may be used as a borazine-ring-skeleton-free boron-containing gas, a borazine-ring-skeleton-containing gas, a carbon-containing gas, a nitrogen-containing gas and a gas containing N and C. The processing conditions used in this case may be the same as those of the aforementioned embodiment.

In the case of forming the TaBCN film or the TaBN film, for example, a precursor gas containing Ta and a halogen element may be used as a Ta-containing precursor gas. As the precursor gas containing Ta and a halogen element, it may be possible to use, e.g., a precursor gas containing Ta and a chloro group, such as a tantalum pentachloride ($TaCl_5$) gas or the like, or a precursor gas containing Ta and a fluoro group, such as a tantalum pentafluoride ($TaF_5$) gas or the like. The same gases as used in the aforementioned embodiment may be used as a borazine-ring-skeleton-free boron-containing gas, a borazine-ring-skeleton-containing gas, a carbon-containing gas, a nitrogen-containing gas and a gas containing N and C. The processing conditions used in this case may be the same as those of the aforementioned embodiment.

In the case of forming the AlBCN film or the AlBN film, for example, a precursor gas containing Al and a halogen element may be used as an Al-containing precursor gas. As the precursor gas containing Al and a halogen element, it may be possible to use, e.g., a precursor gas containing Al and a chloro group, such as an aluminum trichloride ($AlCl_3$) gas or the like, or a precursor gas containing Al and a fluoro group, such as an aluminum trifluoride ($AlF_3$) gas or the like. The same gases as used in the aforementioned embodiment may be used as a borazine-ring-skeleton-free boron-containing gas, a borazine-ring-skeleton-containing gas, a carbon-containing gas, a nitrogen-containing gas and a gas containing N and C. The processing conditions used in this case may be the same as those of the aforementioned embodiment.

In the case of forming the MoBCN film or the MoBN film, for example, a precursor gas containing Mo and a halogen element may be used as a Mo-containing precursor gas. As the precursor gas containing Mo and a halogen element, it may be possible to use, e.g., a precursor gas containing Mo and a chloro group, such as a molybdenum pentachloride ($MoCl_5$) gas or the like, or a precursor gas containing Mo and a fluoro group, such as a molybdenum pentafluoride ($MoF_5$) gas or the like. The same gases as used in the aforementioned embodiment may be used as a borazine-ring-skeleton-free boron-containing gas, a borazine-ring-skeleton-containing gas, a carbon-containing gas, a nitrogen-containing gas and a gas containing N and C. The processing conditions used in this case may be the same as those of the aforementioned embodiment.

That is to say, the present disclosure may be suitably applied to a case where a thin film containing a predetermined element such as a semiconductor element, a metal element or the like is formed.

Process recipes (e.g., programs describing process procedures and process conditions) used in forming these various kinds of films may be individually prepared in a plural number according to the contents of substrate processing (e.g., the kind, composition ratio, quality and thickness of the film to be formed). In addition, at the start of the substrate processing, an appropriate process recipe may be properly selected from the process recipes according to the substrate processing contents. Specifically, the process recipes individually prepared according to the substrate processing contents may be stored (or installed) in advance in the memory device 121c of the substrate processing apparatus via a telecommunication line or a recording medium (e.g., the external memory device 123) storing the process recipes. Moreover, at the start of the substrate processing, the CPU 121a of the substrate processing apparatus may properly select an appropriate process recipe from the process recipes stored in the memory device 121c according to the substrate processing contents. This configuration enables a single substrate processing apparatus to form films having different composition ratios, qualities and thicknesses for general purposes and with enhanced reproducibility. In addition, this configuration can reduce an operator's operation burden (a burden borne by an operator when inputting process procedures and process conditions), thereby avoiding a manipulation error and quickly starting the substrate processing.

The process recipes are not limited to newly prepared ones but may be prepared by, for example, modifying the existing process recipes already installed in the substrate processing apparatus. In the case of modifying the process recipes, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing conditions may be the same as those of the aforementioned embodiment.

The embodiments and modified examples described above may be appropriately combined with one another. In this case, the processing conditions may be the same as those of the aforementioned embodiments.

ASPECTS OF THE PRESENT DISCLOSURE

Hereinafter, some aspects of the present disclosure will be additionally stated as supplementary notes.

(Supplementary Note 1)

According to one aspect of the present disclosure, there is provided a method of manufacturing a semiconductor device, including forming a laminated film on a substrate by performing a cycle a first predetermined number of times (n times), the cycle including:

forming a first film which contains a predetermined element, boron and nitrogen and which does not contain a borazine ring skeleton; and forming a second film which contains the predetermined element and a borazine ring skeleton (a film which contains the predetermined element, boron and nitrogen and which contains a borazine ring skeleton), wherein the first film and the second film are laminated to form the laminated film.

(Supplementary Note 2)

In the method of Supplementary Note 1, forming the first film may include performing a first set a second predetermined number of times ($m_1$ times), the first set including:

supplying a first precursor gas containing the predetermined element to the substrate;

supplying a boron-containing gas which does not contain a borazine ring skeleton (borazine-ring-skeleton-free boron-containing gas) to the substrate; and supplying a nitrogen-containing gas or a nitrogen- and carbon-containing gas to the substrate.

As the precursor gas, it may be possible to use, e.g., a precursor gas containing the predetermined element and a halogen element. As the boron-containing gas, it may be possible to use, e.g., a borane-based gas. As the nitrogen-containing gas, it may be possible to use, e.g., a nitriding gas such as a hydrogen nitride-based gas or the like. As the nitrogen- and carbon-containing gas, it may be possible to use, e.g., an amine-based gas or an organic hydrazine-based gas.

(Supplementary Note 3)

In the method of Supplementary Note 2, the first set may further include supplying a carbon-containing gas to the substrate.

For example, the act of supplying the carbon-containing gas is performed prior to the act of supplying the nitrogen-containing gas. As another example, the act of supplying the carbon-containing gas is performed simultaneously or non-simultaneously with the act of supplying the nitrogen- and carbon-containing gas. As the carbon-containing gas, it may be possible to use, e.g., a hydrocarbon-based gas.

(Supplementary Note 4)

In the method of any one of Supplementary Notes 1 to 3, forming the second film may include performing a second set a third predetermined number of times ($m_2$ times), the second set including:

supplying a second precursor gas containing the predetermined element to the substrate; and supplying a borazine-ring-skeleton-containing gas to the substrate, wherein the second set is performed under a condition in which a borazine ring skeleton in the borazine-ring-skeleton-containing gas is maintained.

As the precursor gas, it may be possible to use, e.g., a precursor gas containing the predetermined element and a halogen element. As the borazine-ring-skeleton-containing gas, it may be possible to use, e.g., a gas containing a borazine ring skeleton and an organic ligand, such as an organic borazine-based gas or the like.

(Supplementary Note 5)

In the method of Supplementary Note 4, the second set may further include supplying a nitrogen-containing gas or a nitrogen- and carbon-containing gas to the substrate.

As the nitrogen-containing gas, it may be possible to use, e.g., a nitriding gas such as a hydrogen nitride-based gas or the like. As the nitrogen- and carbon-containing gas, it may be possible to use, e.g., an amine-based gas or an organic hydrazine-based gas.

(Supplementary Note 6)

In the method of Supplementary Note 4 or 5, the second set may further include supplying a carbon-containing gas to the substrate.

For example, the act of supplying the carbon-containing gas is performed prior to the act of supplying the nitrogen-containing gas. As another example, the act of supplying the carbon-containing gas is performed simultaneously or non-simultaneously with the act of supplying the nitrogen- and carbon-containing gas. As a further example, the act of supplying the carbon-containing gas is performed simultaneously or non-simultaneously with the act of supplying the borazine-ring-skeleton-containing gas. As the carbon-containing gas, it may be possible to use, e.g., a hydrocarbon-based gas.

(Supplementary Note 7)

In the method of any one of Supplementary Notes 1 to 6, each of the first film and the second film has a thickness ranging from 0.1 nm to 5 nm, or specifically 0.1 nm to 1 nm.

(Supplementary Note 8)

In the method of any one of Supplementary Notes 1 to 7, each of the first set and the second set may be performed one or more times and 50 times or less, or specifically, e.g., one or more times and 10 times or less.

(Supplementary Note 9)

In the method of any one of Supplementary Notes 1 to 8, the laminated film may be a nano-laminated film composed of the first film and the second film alternately laminated at a nanoscale thickness.

(Supplementary Note 10)

In the method of any one of Supplementary Notes 1 to 9, the first film may be formed first in the act of performing the cycle. That is to say, prior to forming the second film, the first film is formed as a base of the second film. Then, the second film is formed on the first film. That is to say, the lowermost portion of the laminated film composed of the first film and the second film is configured by the first film.

(Supplementary Note 11)

In the method of any one of Supplementary Notes 1 to 10, the first film may be performed last in the act of performing the cycle. That is to say, after forming the second film, the surface of the second film is covered with the first film. In other words, the uppermost portion of the laminated film composed of the first film and the second film is configured by the first film.

(Supplementary Note 12)

According to another aspect of the present disclosure, there is provided a substrate processing apparatus, including:
 a process chamber configured to accommodate a substrate;
 a first gas supply system configured to supply a precursor gas containing a predetermined element to the substrate in the process chamber:
 a second gas supply system configured to supply a boron-containing gas which does not contain a borazine ring skeleton to the substrate in the process chamber;
 a third gas supply system configured to supply a borazine-ring-skeleton-containing gas to the substrate in the process chamber;
 a fourth gas supply system configured to supply a nitrogen-containing gas to the substrate in the process chamber;
 a heater configured to heat the substrate in the process chamber;
 a pressure regulating unit configured to regulate an internal pressure of the process chamber; and
 a control unit configured to control the first gas supply system, the second gas supply system, the third gas supply system, the fourth gas supply system, the heater, and the pressure regulating unit to form a laminated film on the substrate in the process chamber by performing a cycle a predetermined number of times (n times), the cycle including: forming a first film which contains the predetermined element, boron and nitrogen and which does not contain a borazine ring skeleton; and forming a second film which contains the predetermined element and a borazine ring skeleton, wherein the first film and the second film are laminated to form the laminated film.

(Supplementary Note 13)

According to a further aspect of the present disclosure, there is provided a non-transitory computer-readable recording medium storing a program that causes a computer to perform a process of forming a laminated film on a substrate by performing a cycle a predetermined number of times (n times), the cycle including:
 forming a first film which contains a predetermined element, boron and nitrogen and which does not contain a borazine ring skeleton; and
 forming a second film which contains the predetermined element and a borazine ring skeleton,
 wherein the first film and the second film are laminated to form the laminated film.

According to the present disclosure, it is possible to enhance the controllability of a composition ratio control operation and the controllability of a film property control operation when forming a film.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a laminated film on a substrate by performing a manufacturing cycle of a first predetermined number of times, the manufacturing cycle comprising:
 forming a first film which contains a predetermined element, boron, and nitrogen and which does not contain a borazine ring skeleton; and
 forming a second film which contains the predetermined element and a borazine ring skeleton,
 wherein the first film and the second film are laminated to form the laminated film;
  wherein forming the first film includes performing a first set, a second predetermined number of times, the first set comprising:
  supplying a first precursor gas containing the predetermined element to the substrate;
  supplying a boron-containing gas which does not contain a borazine ring skeleton to the substrate; and
  supplying a nitrogen-containing gas or a nitrogen- and carbon-containing gas to the substrate;
  wherein forming the second film includes performing a second set, a third predetermined number of times, the second set comprising:
  supplying a second precursor gas containing the predetermined element to the substrate; and
  supplying a borazine-ring-skeleton-containing gas to the substrate, and
  wherein the second set is performed under a condition in which a borazine ring skeleton in the borazine-ring-skeleton-containing gas is maintained.

2. The method of claim 1, wherein the first set further comprises supplying a carbon-containing gas to the substrate.

3. The method of claim 1, wherein the second set further comprises supplying a nitrogen-containing gas or a nitrogen- and carbon-containing gas to the substrate.

4. The method of claim 1, wherein the second set further comprises supplying a carbon-containing gas to the substrate.

5. The method of claim 1, wherein each of the first film and the second film has a thickness ranging from 0.1 nm to 5 nm.

6. The method of claim 1, wherein the laminated film is a nano-laminated film composed of the first film and the second film alternately laminated at a nanoscale thickness.

7. The method as in claim 1, wherein the first film is formed first in the act of performing the manufacturing cycle.

8. The method as in claim 1, wherein the first film is formed last in the act of performing the manufacturing cycle.

9. A substrate processing apparatus, comprising:
 a process chamber configured to accommodate a plurality of wafers as substrates;
 a first gas supply system configured to supply a precursor gas containing a predetermined element to the substrate in the process chamber;
 a second gas supply system configured to supply a boron-containing gas which does not contain a borazine ring skeleton to the substrate in the process chamber;

a third gas supply system configured to supply a borazine-ring-skeleton-containing gas to the substrate in the process chamber;
a fourth gas supply system configured to supply a nitrogen-containing gas to the substrate in the process chamber;
a heater configured to heat the substrate in the process chamber;
a reaction tube is disposed inside the heater and is made of a heat resistant material of either silicon oxide or silicon carbide;
a plurality of nozzles configured to penetrate through a lower portion of the reaction tube;
a pressure regulating unit configured to regulate an internal pressure of the process chamber; and
a control unit configured to control the first gas supply system, the second gas supply system, the third gas supply system, the fourth gas supply system, the heater, and the pressure regulating unit to form a laminated film on the substrate in the process chamber by performing a processing cycle of a predetermined number of times, the cycle comprising:
forming a first film which contains the predetermined element, boron, and nitrogen and which does not contain a borazine ring skeleton; and
forming a second film which contains the predetermined element and a borazine ring skeleton,
wherein the first film and the second film are laminated to form the laminated film.

* * * * *